(12) United States Patent
Frost et al.

(10) Patent No.: US 7,997,289 B1
(45) Date of Patent: Aug. 16, 2011

(54) METHODS OF AND APPARATUS FOR CLEANING AND CONVEYING A SUBSTRATE

(75) Inventors: Dave Frost, Scotts Valley, CA (US); Sean Harbison, Scotts Valley, CA (US); Yassin Mehmandoust, Scotts Valley, CA (US); Mike Frocappa, Scotts Valley, CA (US)

(73) Assignee: Xyratex Technology Limited (GB)

( * ) Notice: Subject to any disclaimer, the term of this patent is extended or adjusted under 35 U.S.C. 154(b) by 506 days.

(21) Appl. No.: 11/866,396

(22) Filed: Oct. 2, 2007

Related U.S. Application Data

(60) Provisional application No. 60/827,886, filed on Oct. 3, 2006.

(51) Int. Cl.
*B08B 3/02* (2006.01)

(52) U.S. Cl. ............ 134/137; 134/61; 134/133; 406/88; 406/134

(58) Field of Classification Search .................. None
See application file for complete search history.

(56) References Cited

U.S. PATENT DOCUMENTS

| | | | |
|---|---|---|---|
| 3,643,671 A * | 2/1972 | Henninges et al. ........... | 134/118 |
| 6,241,427 B1 * | 6/2001 | Hessburg et al. ............... | 406/88 |
| 2003/0183246 A1 * | 10/2003 | Boyd et al. ..................... | 134/1.3 |
| 2004/0012363 A1 * | 1/2004 | Simondet ................. | 318/568.21 |
| 2004/0055625 A1 * | 3/2004 | Fishkin et al. .................. | 134/30 |
| 2006/0285930 A1 * | 12/2006 | de Larios et al. ............. | 406/197 |

* cited by examiner

Primary Examiner — Michael Kornakov
Assistant Examiner — Ryan Coleman
(74) Attorney, Agent, or Firm — Martine Penilla & Gencarella, LLP

(57) ABSTRACT

Discs roll along an inclined track through a chamber to expose opposite disc sides for cleaning. Energized fluid directed against the opposite sides removes particles from the discs, the fluid and particles exiting the chamber. Stop pins control a time period for cleaning and transporting the discs by selectively blocking or releasing the discs. The discs are stopped at many sections of a transducer, the sections being tailored to provide various cleaning characteristics. Within the chamber, the chamber is configured to minimize particles that originate other than by being adhered to the disc at a time when the disc is introduced into the chamber. Internal chamber configuration also minimizes retention of particles so that particles removed from one disc do not linger in the chamber for possible transfer to a disc that is cleaned in the same chamber at a later time.

20 Claims, 15 Drawing Sheets

FIG. 12

FLOW CHART 630

632: ENCLOSE A DISC IN A NARROW ELONGATED SPACE EXTENDING FROM A DISC ENTRANCE TO A DISC EXIT, THE SPACE BEING DEFINED BY OPPOSED SURFACES AND THE ENCLOSED DISC BEING SUPPORTED ON AN INCLINED FLOOR

634: DIRECT ENERGIZED FLUID THROUGH EACH OPPOSED SURFACE ONTO THE ENCLOSED SUPPORTED DISC TO POSITION THE DISC IN A VERTICAL ORIENTATION BETWEEN THE OPPOSED SURFACES

636 ALLOW THE ENCLOSED SUPPORTED DISC TO ROLL ON THE FLOOR THROUGH THE ENERGIZED FLUID

DONE

FIG. 13

FLOW CHART 640

642: PERFORM THE METHOD OF FLOW CHART 630.

644: PERFORM AT THE EXIT THE REMOVING OF A DISC FROM BETWEEN THE OPPOSED SURFACES TO MAKE ROOM ALONG THE FLOOR FOR ANOTHER DISC ON THE FLOOR AT THE ENTRANCE

DONE.

FIG. 14.

FLOW CHART 650

652: PERFORM THE METHOD OF FLOW CHART 130

654: INTERRUPT THE ROLLING OF THE DISC AT A PREDETERMINED LOCATION BETWEEN THE ENTRANCE AND THE END

DONE

METHODS OF AND APPARATUS FOR CLEANING AND CONVEYING A SUBSTRATE

RELATED APPLICATION

This application is claims priority to U.S. Provisional Application No. 60/827,886 filed on Oct. 3, 2006 and entitled: "Brush, Methods for Making the Brush, and Apparatuses for Cleaning and Conveying a Substrate."

FIELD

Background

Many processes for semiconductor and disk manufacturing require extremely clean workpieces before the processes may start. For example, particulates or contaminates that attach to or form on the workpiece before processing may eventually cause defects in the workpiece. When the workpieces are disks to be processed, such particulates or contaminates may be hydrophobic or hydrophyllic, and may include layers, e.g., thin oxide surface layers; surface asperities such as scratches, nodules, and ridges that may be induced by a prior polishing operation; materials adhered to the workpiece due to the polishing operation; and loosely adhered particles from the environment in which the workpiece has been stored. These particulates or contaminates may also be aged, and thus be more stable and more difficult to remove before the processing. Cleaning, then, is a process intended to remove substantially all of such particulates or contaminates from workpieces before processing, such as processing of magnetic media or semiconductor workpieces. A clean workpiece is thus a workpiece from which substantially all of such particulates or contaminates have been removed before processing.

Therefore, there is a need for improving techniques for cleaning workpieces, such as those workpieces that present problems of such more difficult removal of substantially all of such particulates or contaminates from the workpieces before processing. Moreover, these improved techniques must allow cleaning of a workpiece to be done quickly so as to reduce the cost of capital equipment for the cleaning. However, the Applicants of the present application have determined that to meet this more difficult removal problem, in some situations more time should be spent cleaning the workpiece. For example, such determinations include that when a fluid is used for the cleaning, in general more time should be provided for contact at an interface of the fluid and the workpiece (i.e., at a fluid-workpiece interface). However, the need for more contact time at this interface conflicts with the need for the cleaning of the workpiece to be done quickly. Also, the Applicants of the present application have determined that it is desirable to have each workpiece, of a group of workpieces to be cleaned, be cleaned under the same conditions and still have more time for contact at the fluid-workpiece interface. In this manner, workpiece uniformity would be fostered, and would be preferable over the batch cleaning described below in which a fluids are re-circulated in a bath and there is no control of what type of re-circulated fluid is actually used to clean a particular workpiece of the group.

What is needed then, is apparatus configured to clean workpieces quickly, yet during the cleaning operation of one workpiece, to increase the time provided for contact at the fluid-workpiece interface according to characteristics of the workpiece. What is also needed is apparatus configured to clean a group of workpieces, wherein all workpieces of the group are cleaned by fluid having the same cleaning characteristic. What is also needed, then, is to minimize particles in a cleaning chamber that originate other than by being adhered to the workpiece at a time when the workpiece is introduced into the chamber, and to minimize the retention of particles in a cleaning chamber so that particles removed from one workpiece do not linger in the chamber for possible transfer to a workpiece that is cleaned in the same chamber at a later time.

SUMMARY

Broadly speaking, embodiments of the present invention fill these needs by providing methods of and apparatus configured to clean workpieces quickly, yet during the cleaning operation of one workpiece, to increase contact time at the fluid-workpiece interface; and by providing methods and apparatus configured to clean a group of workpieces, wherein all workpieces of the group are cleaned by fluid having the same cleaning characteristic. Embodiments of the present invention fill these needs by minimizing the particles in a cleaning chamber that originate other than by being adhered to the workpiece at a time when the workpiece is introduced into the chamber. Embodiments of the present invention also fill these needs by minimizing the retention of particles in a cleaning chamber so that particles removed from one workpiece do not linger in the chamber for possible transfer to a workpiece that is cleaned in the same chamber at a later time.

Embodiments of the present invention may provide apparatus for cleaning and transporting a disc having opposite sides and a circular edge between the sides. The apparatus may include a floor configured to support the edge with the disc in a vertical orientation. The apparatus may also include walls configured to define a space enclosing the disc supported on the edge, each wall being configured to guide combined vibratory energy and fluid through the space onto the opposite sides of the disc to maintain the disc in the vertical orientation and clean the opposite sides while the disc rolls on the floor.

Embodiments of the present invention may provide a process chamber for cleaning and transporting discs, the discs being configured with a narrow thickness between opposite sides and with a circular peripheral edge defined relative to a diameter. The process chamber may include a block assembly configured with opposed vertical internal walls that define a slot. The walls may configure the slot with a narrow width to receive the narrow thickness of a plurality of the discs, the walls being configured elongated to enable the slot to receive a series of the discs with the edge of one disc being adjacent to the edge of a next disc. The walls may be configured in a direction of the elongation with an entrance end and an exit end spaced from the entrance end. The walls may also be configured with a depth greater than the disc diameter, the depth being defined by a floor configured to support the disc edges with each disc of the series in a vertical orientation between the walls. The floor may be tilted relative to horizontal to enable the discs to roll on the floor in response to the force of gravity along a path from the entrance end to the exit end. Each wall may be further configured to guide energized fluid into the slot against one of the opposite sides of the discs and to maintain the discs in the vertical orientation between the walls and to remove particles from the discs while the discs roll on the floor. The floor may be configured with perforations to allow the energized fluid and particles to flow across the opposite sides and downwardly out of the block assembly.

In one embodiment the apparatus includes a generally U-shaped track configured from a pair of plates connected by a floor, the plates being configured closely spaced and extending upwardly from the floor to closely straddle the opposite sides of a disc supported by the floor in a vertical orientation, the track being configured with a disc entrance and a disc exit and elongated between the entrance and exit to define the floor and the plates as an elongated transport path to receive a plurality of the discs at one time. The apparatus also includes a transducer configured to extend along the transport path, the transducer comprising a vibration generator mounted on each of the plates and elongated to extend along the path, each of the generators being configured with a series of ports to direct vibrating fluid against the of the opposite sides of the discs to support the discs with the opposite sides spaced from the plates and only the edges touching the track along the floor. The track of the apparatus is configured with the floor inclined relative to horizontal to enable the discs to roll along the track through the vibrating fluid from the disc entrance to the disc exit.

In another embodiment a sonication and transport chamber is provided. The chamber includes a box in a configuration of a rectangular paralellepiped, the box configured from a plurality of separate box sections to receive and clean and transport thin discs, each of the separate sections being configured with a continuous perimeter defined by a first planar mating surface extending on the respective box section in a longitudinal direction from a disc entrance to a disc exit and in a vertical direction perpendicular to the longitudinal direction to define four sides of the respective box section, each of the sections being further configured with a first recess extending through the first planar mating surface in a thickness direction transverse to the longitudinal direction and extending in the longitudinal direction from the disc entrance to the disc exit and extending in the vertical direction transverse to the longitudinal and transverse directions to a planar terminus that defines a floor, each first recess defining a second planar surface parallel to the first parallel surfaces, the floor being inclined relative to the longitudinal direction along an inclined axis so that an entrance of the floor adjacent to the disc entrance has a vertical dimension less than a vertical dimension of an exit of the floor adjacent to the disc exit, a fluid inlet manifold in each section parallel to the inclined axis, each of the first recesses being further configured with a second recess extending through the second planar surface in the thickness direction and extending in a direction of the inclined axis from the disc entrance to the disc exit and extending in a vertical direction transverse to the inclined axis and transverse directions to a second terminus adjacent to the floor to define a third planar surface parallel to the first planar surface, each box section being further configured with a first array of fluid entrance ports extending through the third planar surface in the thickness direction, the ports being spaced along the inclined axis and intersected by the fluid inlet manifold. The chamber includes an elongated transducer plate received in each of the second recesses and extending in the direction of the inclined axis, each transducer plate being configured with a second array of fluid outlets, each outlet in one transducer being configured aligned with one of the fluid entrance ports in the corresponding box section and opposed to and aligned with a fluid outlet in the other box section to receive sonically energized fluid from the aligned port and to supply the sonically energized fluid against a side of one of the discs, opposite sides of the disc being impacted by the supplied energized fluid to provide support in the transverse direction for discs rolling on the floor, the support in the transverse direction maintaining the discs in the vertical orientation with the opposite sides closely adjacent to the transducer plates and only circular edges of the discs touching the second planar surface as discs roll along the floor, each of the transducer plates with the respective array of ports being configured with a fourth planar surface that is an extension of the respective second planar surface of the respective box section to minimize structure protruding away from the respective third planar surface. Each box section is further configured with drain outlets providing openings through the floor through which to drain the sonically energized fluid and particles from the discs from the chamber, wherein each box section is further configured with a connector to join the box sections along the first planar mating surface of the continuous perimeter so that the second planar surfaces and the fourth planar surfaces recesses define opposite sides of the sonication and transport chamber.

In yet another embodiment, an apparatus for cleaning and transporting a disc having opposite sides, a circular edge between the sides, and a hole in the center spaced from the edge is provided. The apparatus includes a cleaning and transporting chamber configured to minimize retention of particles removed from the disc, the chamber being configured from an elongated rectangular block having opposite planar sides and a top and a bottom and opposite ends, the block being configured with spaced fluid supply manifolds and a fluid exit manifold, the block being configured with a sonication cavity extending through the top and toward the bottom to define opposite cavity ends and opposite cavity walls extending to a disc track inclined with respect to the bottom, the opposite cavity ends and opposite cavity walls defining the chamber as being closed with the top open, one cavity end being a disc entrance and the other end being a disc exit, each opposite cavity wall being configured intersected by a first array of fluid supply ports, the first array extending between the cavity ends and extending to one of the fluid supply manifolds, the disc track being configured intersected by a second array of fluid exit ports, the second array being configured to extend between the cavity ends with each fluid exit port connected to the fluid exit manifold, the block being configured with each of the opposite cavity walls spaced by a first distance to receive a disc in a vertical orientation extending to the disc track, the block being configured with each of the opposite cavity walls being planar except for an elongated recess extending between the ends and into each cavity wall and except for a disc transfer groove at each of the disc entrance and disc exit, the disc transfer grooves being wider than the first distance. The apparatus includes a vibration generator comprising a transducer configured for reception in each of the elongated recesses in each of the cavity walls so as to configure each opposite cavity wall as a planar surface, each transducer being configured with a third array of fluid supply ports with each port of the third array aligned with one of the ports of the first array, each transducer being configured to sonically energize a fluid in the ports of the first and third arrays and entering the cavity to impinge on the opposite sides of the disc.

Embodiments of the present invention may also provide a method of cleaning and transporting a disc. The method may comprise an operation of enclosing the disc in a narrow space that is elongated to extend from a disc entrance to a disc exit and is defined by opposed walls with the enclosed disc supported on a floor of the space extending between the opposed walls and inclined relative to horizontal. Another operation may direct energized fluid through each opposed wall onto the enclosed supported disc to position the disc in a vertical orientation between the opposed walls. Another operation may allow the enclosed supported disc to roll on the floor through the energized fluid.

It will be obvious; however, to one skilled in the art, that embodiments of the present invention may be practiced without some or all of these specific details. In other instances, well known process operations have not been described in detail in order not to obscure the present invention.

DESCRIPTION OF THE DRAWINGS

Aspects of the present invention will become apparent from the following detailed description, taken in conjunction with the accompanying drawings, illustrating by way of example the principles of embodiments of the present invention.

FIGS. 12-14 are flow chart diagrams illustrating operations of method embodiments for cleaning and transporting discs in accordance with embodiments of the present invention.

DETAILED DESCRIPTION

The embodiments described below describe apparatus for cleaning a workpiece. In one embodiment, the apparatus may be used to clean magnetic disks that store data. It should be appreciated that the embodiments are not limited to cleaning magnetic disks, in that any semiconductor circuit device, flat panel display, or other substrate may be cleaned by the embodiments described herein. The term workpiece as used herein may refer to any substrate being processed. In addition, the terms disk and disc are used interchangeably, and may also reference any such substrate or workpiece.

Embodiments of the present invention may fill the above needs by providing methods of and apparatus configured to clean workpieces quickly, yet during the cleaning operation of one workpiece, to increase contact time at a fluid-workpiece interface; and by providing methods and apparatus configured to clean a group of workpieces, wherein all workpieces of the group are cleaned by fluid having the same cleaning characteristic. Embodiments of the present invention fill these needs by minimizing the particles in a cleaning chamber that originate other than by being adhered to the workpiece at a time when the workpiece is introduced into the chamber. Embodiments of the present invention also fill these needs by minimizing the retention of particles in a cleaning chamber so that particles removed from one workpiece do not linger in the chamber for possible transfer to a workpiece that is cleaned in the same chamber at a later time. It should be appreciated that the present invention may be implemented in numerous ways, such as a process, an apparatus, a system, a device or a method. Several inventive embodiments of the present invention are described below.

Figure 1A:
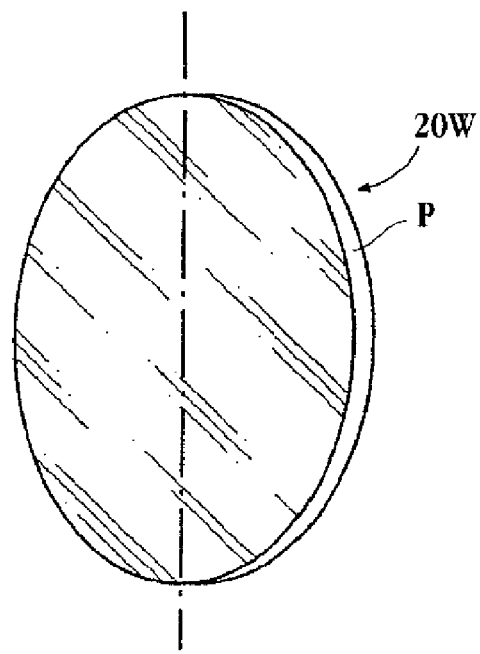
FIGS. 1A, 1B, and 1C are views of workpieces such as discs that may be cleaned in accordance with one embodiment of the invention.
Figure 1B:
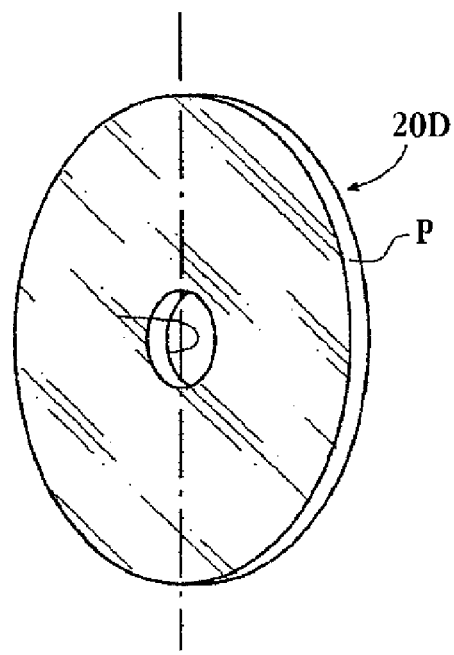
Figure 1C:
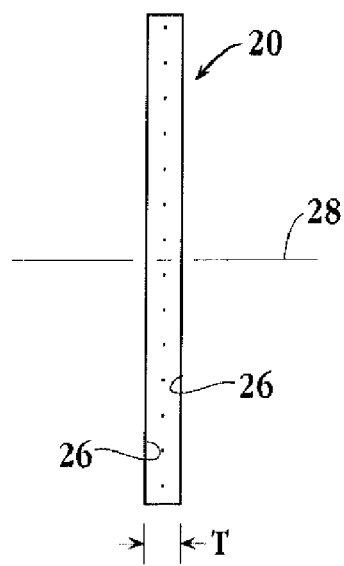

Referring to FIGS. 1A-1C, in a general sense, embodiments of the present invention may both clean an above-described substrate or workpiece, such as a disc-shaped member, or disc, collectively referred to below as a disc, 20 and transport the disc from a disc entrance (or entrance) 22 to a disc exit (or exit) 24. Exemplary discs may be a semiconductor wafer or substrate 20W (FIG. 1A) on which layers are to be deposited, or a magnetic media disc 20D (FIG. 1B), for example. FIG. 1C shows the disc 20 configured with spaced planar surfaces, or sides, 26 on which either the materials of the magnetic media disc 20D are provided, or on which the layers of the wafer 20W are to be deposited. The sides 26 define a thickness T, and are to be cleaned by the apparatus that may be made by methods of the present invention. The disc may have an axis 28 of rotation. A disc edge (or perimeter P) of the disc 20 may extend around the axis 28. The disc 20D may be provided with a central aperture, and each disc 20 may have a radius of a standard value such as 300 mm (disc 20W) or 95 mm (disc 20D).

Figure 2:
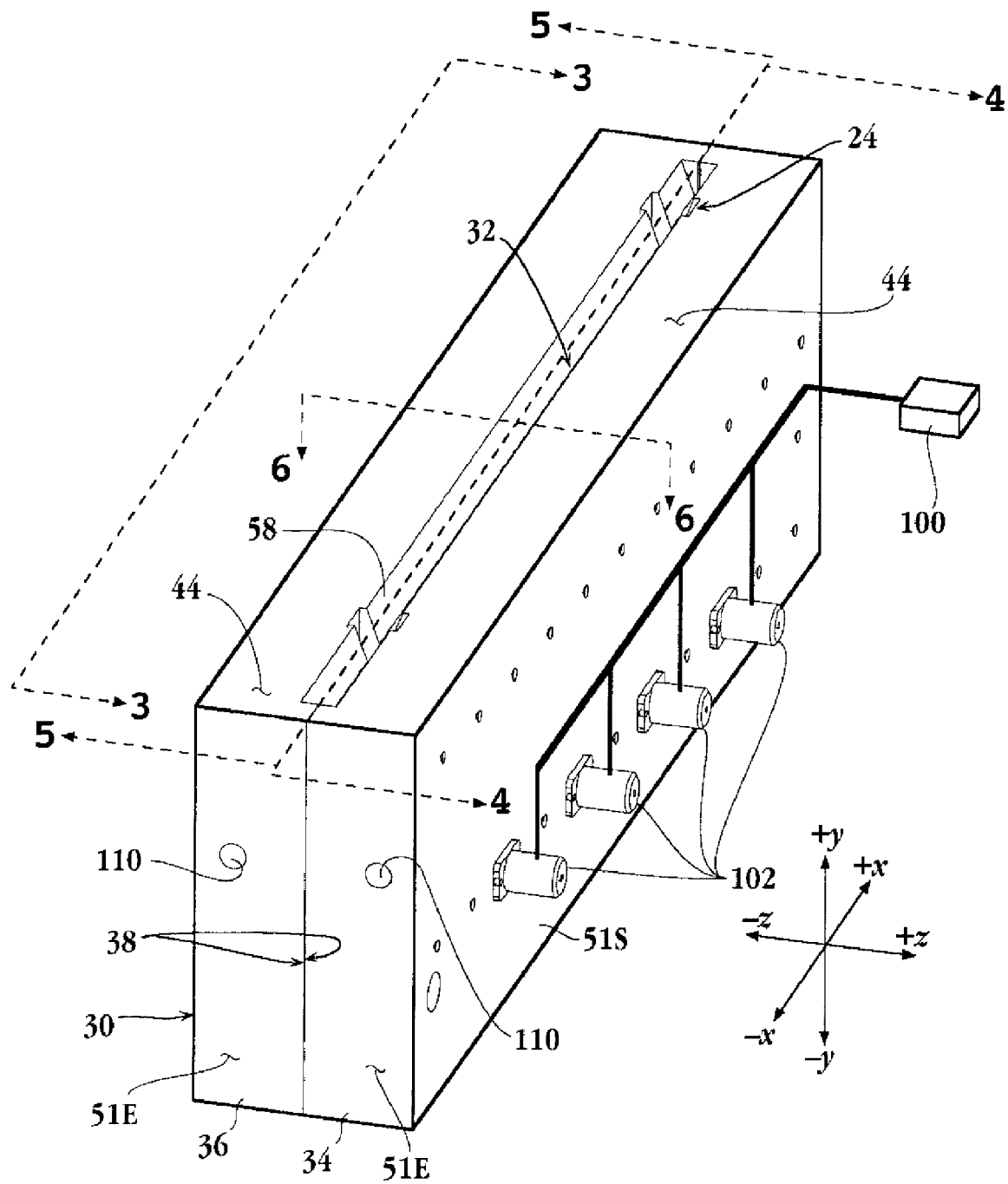
FIG. 2 is a perspective view of a block assembly of one embodiment of the present invention for simultaneously cleaning cascaded discs and transporting the discs from an entrance to an exit.

For ease of description, embodiments of the present invention are described with respect to an orthogonal system of axes including mutually perpendicular axes X, Y and Z shown in FIG. 2. The X axis defines a direction of a longitudinal axis of the embodiments, the Y axis defines a direction of height, and the Z axis defines a direction of width (or a transverse direction). FIG. 2 shows an embodiment of the present invention described as a cleaner (or sonication cleaner or block or box) 30 used for both cleaning the disc 20 and transporting the disc in the X direction from the entrance 22 to the exit 24. The entrance and exit are configured as part of a slot (or sonication cavity or cleaning chamber) 32. The chamber 32 extends in the block in all three directions X, Y and Z.

Figure 3:
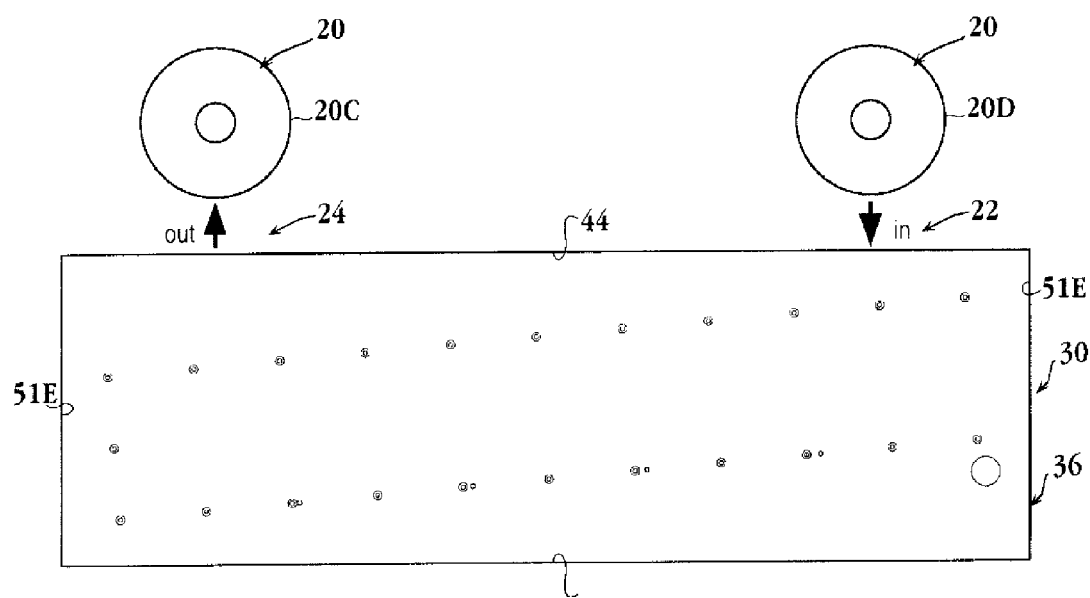
FIG. 3 is a side elevational view taken on line 3-3 in FIG. 2 showing the exterior of one block section of the block assembly shown in FIG. 2.

The block 30 may be configured from two block (or box) sections 34 and 36. Generally, the block sections 34 and 36 are in a "mirrored configuration", one being the same, or nearly the same, as the other in an opposite sense. FIG. 3 is an elevational view of block section 36 showing the disc 20 (here identified as a dirty disc, 20D having particles to be removed by cleaning action inside the chamber 32). Arrow IN indicates loading (or insertion) movement of the disc 20D into the cleaning chamber 32. A disc 20 is identified as a "clean" disc 20C after removal of the particles. "Clean" is as defined above. Arrow OUT indicates pick-up, or removal, movement of the clean disc 20C from the cleaning chamber 32.

Figure 4:
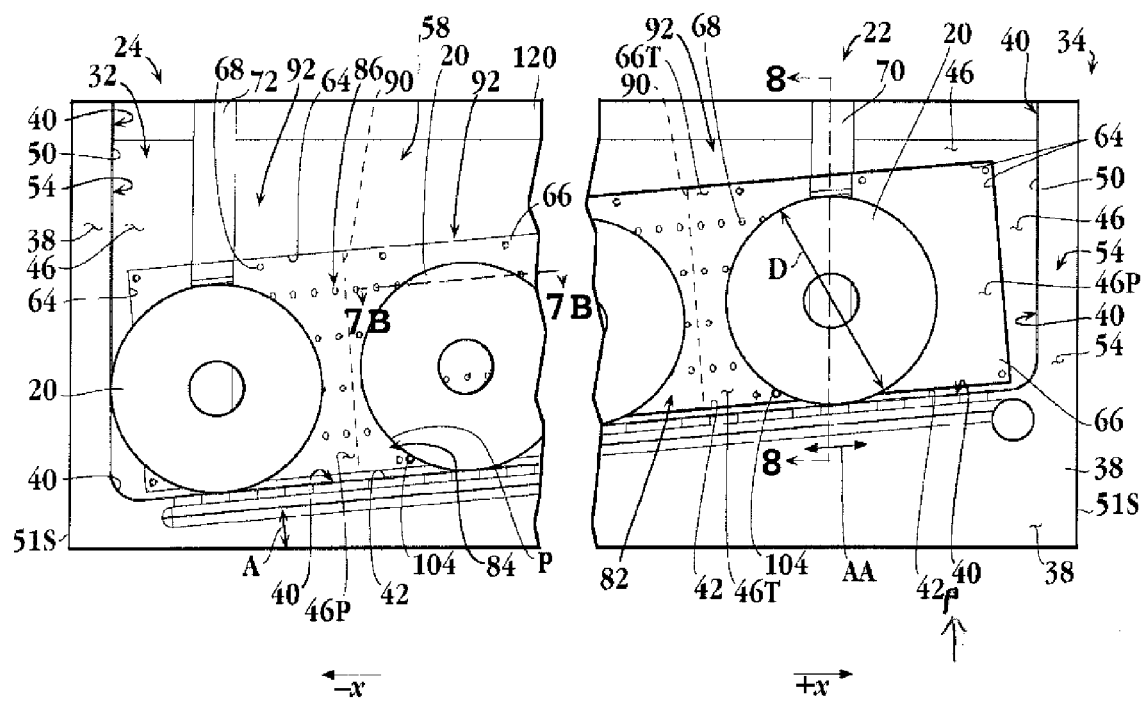
FIG. 4 is a side elevational view taken on line 4-4 in FIG. 2 showing an interior of another block section of the block assembly shown in FIG. 2.
Figure 5:
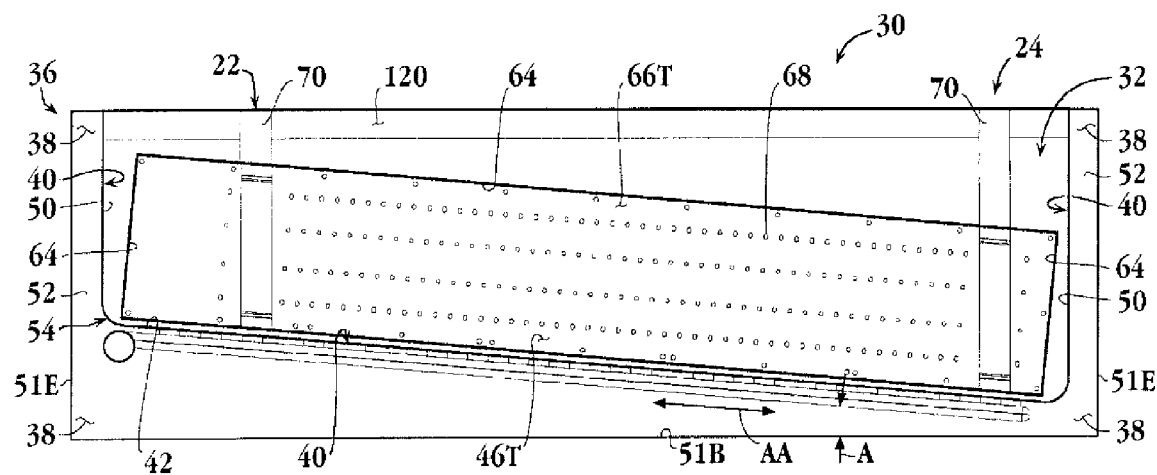
FIG. 5 is a side elevational view taken on line 5-5 in FIG. 2 showing an interior of the one block section of the block assembly shown in FIG. 2.

FIG. 4 is a view along the X axis looking in the positive direction of the Z axis showing an inside of the block 34. A first (generally half) portion of the cleaning chamber 32 is shown configured in the block section 34. In a complementary sense, FIG. 5 is a view along the X axis looking in the negative direction of the Z axis showing an inside of the block section 36. A second (generally half) portion of the cleaning chamber 32 is shown configured in the block section 36. The block sections 34 and 36 may thus be described as plates, with each plate configured with a mating surface 38. The mating surfaces 38 may be referred to as first planar surfaces, and are held tightly together to define the cleaner 30. Thus, the block sections 34 and 36 (or plates) combine to define the chamber 32. Each half-portion of the cleaning chamber 32 is defined by a first recess 40 that extends into each respective block section 34 and 36. In FIGS. 4 and 5, the first recess 40 of each section 34 and 36 is shown configuring the respective half-portion with a portion of a floor. In assembled (or mated or joined) orientation of the block sections 34 and 36, the joined floor portions define a floor 42 configured to support the disc edge P with the disc 20 in a vertical orientation shown in FIG. 4. The floor 42 defines the bottom of the chamber 32. The combined floor portions configure a second planar surface 42P.

Figure 6:
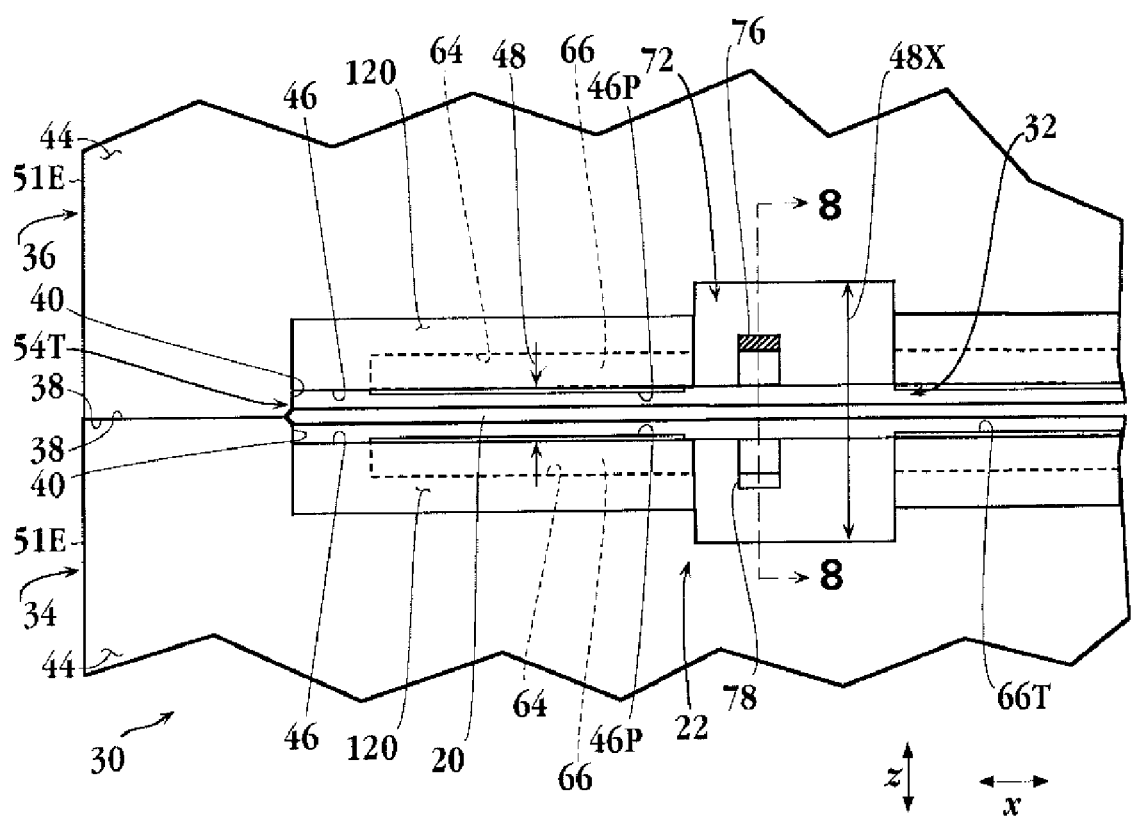
FIG. 6 is a plan view taken on line 6-6 in FIG. 2 showing an opening into a chamber in which the discs are cleaned.

Other aspects of the half-portions are apparent from FIG. 6, a view looking down (in the negative Y direction) showing a top 44 of each section 34 and 36 of the sonication cleaner 30. FIG. 6 also shows the first recesses 40 configuring the block sections 34 and 36 with side walls 46 that define another part of the cleaning chamber 32. FIG. 4 shows a third planar surface 46P of the side walls 46 extend upwardly from the floor 42 to the top 44. The side walls 46 are shown in FIG. 6 configured to define the chamber 32 having a space (dimension arrows 48) in the Z direction, the space defining a width of the chamber 32. The enlarged view of FIG. 7 also shows the first recess 40 in each of the block sections 34 and 36 configured to define half-portions that combine to define an end wall 50 of the cleaning chamber 32 adjacent to the entrance 22. Similarly, FIG. 4 shows that at the exit 24 the first recess 40 in the block section 34 is configured to define a half-portion of an opposite end wall 50 of the cleaning chamber 32 adjacent to the exit 24. Section 36 is similarly configured. On mating of the mating surfaces 38, the combined half-portions configure, or define, fourth planar surfaces 50P of the ends 50.

FIGS. 4 and 5 show the sections 34 and 36 in opposite orientations, the entrance 22 being on the right in FIG. 4, and the entrance 22 being on the left in FIG. 5. These FIGs. show that the first recess 40 is spaced from each of three outside edges 51 of each of the respective block sections 34 and 36, shown as bottom 51B and two side edges 51S. The spaced first recess 40 defines a continuous perimeter 52 (FIGS. 5 and 7A) into which the first recess 40 extends. The perimeter 52 is defined by the remaining (not recessed) portions of the first planar, or mating, surface 38. The remaining surface 38, and thus the perimeter 52, extend on the respective block section 34 and 36 in the longitudinal (X) direction from the entrance 22 to the exit 24. The mating surface and perimeter also extend along the bottom edge 51B of the block 30, and in the vertical (Y) direction to the top 44.

With the mating surfaces 38 joined together as shown in FIGS. 2 and 6 (e.g., by fasteners), and with the first recess 40 formed in the block sections 34 and 36, the chamber 32 is defined with the planar surfaces 42P, 46P, and 50P as internal chamber surfaces. Thus, with the mating surfaces 38 held (touching tightly) together by suitable fasteners, these internal planar chamber surfaces combine so that the end walls 50, floor 42, and side walls 46 define a multi-planar boundary 54 (FIGS. 4 and 5) that is configured to surround substantially all of the chamber 32. This boundary 54 encloses each disc 20 that is supported on the edge P that rests on the floor 42, with the discs 20 in the vertical orientation shown in FIG. 4. As shown in FIG. 4, for example, such boundary 54 defined by the floor 42 and the ends 50, defines a generally U-shaped track 54T that extends in the X direction and supports the discs 20.

FIG. 6 shows the side walls 46 of the multi-planar boundary 54 configured parallel to the X direction of the block sections 34 and 36. With the side walls 46 spaced by space 48, such sections 34 and 36 are configured closely spaced. Such sections 34 and 36 are also configured extending upwardly from the floor 42 to closely straddle the opposite sides 26 of the disc 20 supported by the floor 42 in the vertical orientation. FIG. 2 shows that the chamber 32 configured by the boundary 54 ends at an opening 58 at the top 44.

Generally, FIG. 6 is a view looking in the −Y direction down into the opening 58. The disc 20 is revealed in that vertical orientation. Within the chamber 32, the enlarged cross-sectional view of FIG. 7A (taken in FIG. 4) shows a further configuration of each of the side walls 46. In general, in this configuration, when the disc 20 is received in the chamber 32 as shown, each side wall 46 guides combined vibratory energy and fluid, or energized fluid, (arrows 60) through the space 48 onto the opposite sides 26 of the disc 20. The fluid 60 is guided, such that there are opposing flows, or jets, (identified by pairs of lead lines 62) impinging on the opposite sides 26 to maintain the disc 20 in the vertical orientation and to clean the particles (not shown) from the opposite sides 26.

Figure 7A:
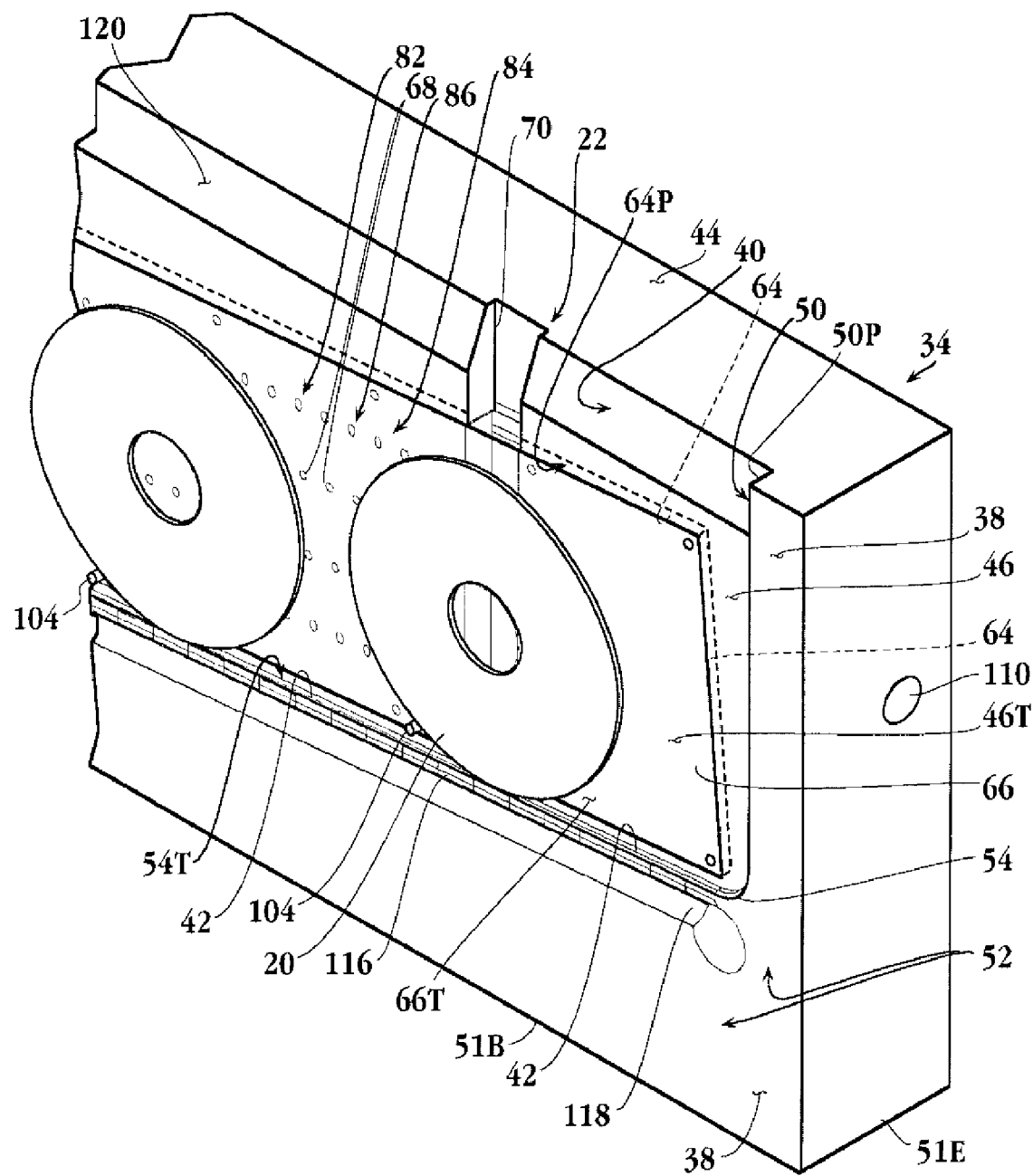
FIG. 7A is an enlarged side elevational view of a portion of FIG. 4, illustrating a groove at an entrance to the chamber to facilitate insertion of discs into the chamber.
Figure 7B:
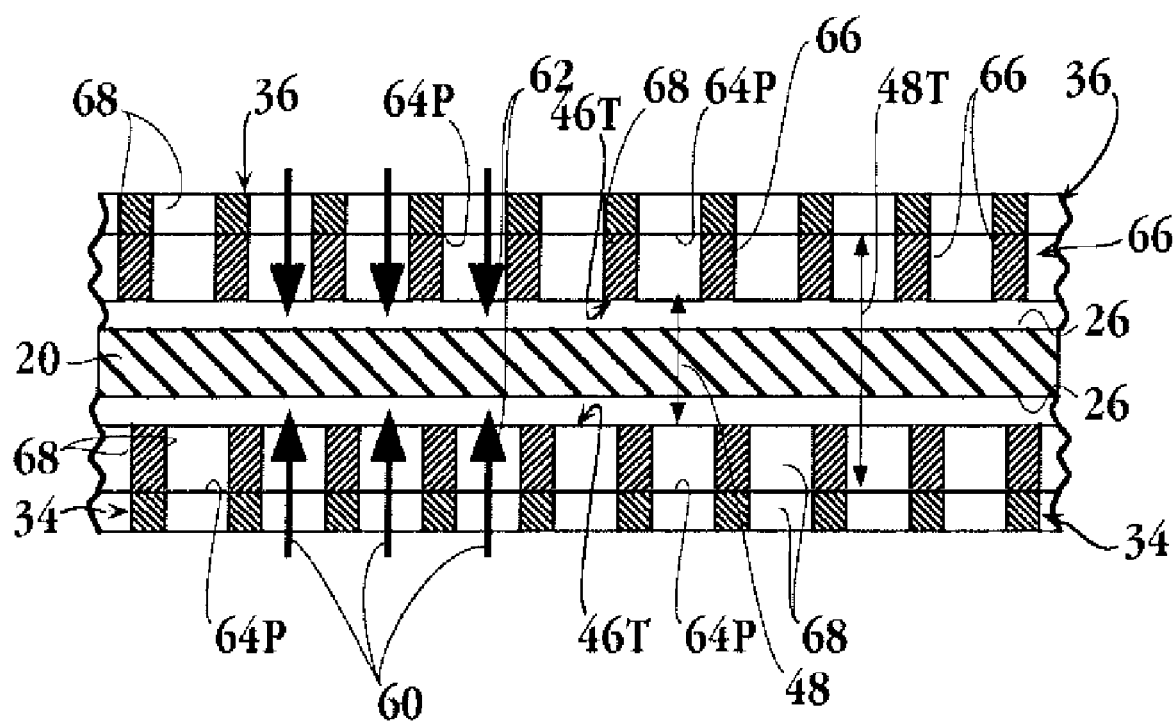
FIG. 7B is a cross sectional view taken on line 7B-7B in FIG. 4 showing an array of ports in opposed walls of the chamber to supply energized fluid to opposite sides of the discs received in the chamber.

FIG. 7A shows an enlarged portion of the block section 34 illustrating this configuration of the side walls 46 to guide the fluid 60. Each respective block section 34 and 36 is configured with a second recess 64 that extends in the Z direction through the wall 46. The recess 64 is configured with a fifth planar surface 64P that enlarges the space 48 in the Z direction, and the enlarged space is shown as 48T in FIG. 7B. FIG. 7B also shows the side wall 46 including a planar surface portion 46T that extends in the x direction across the recess 64, so that the opposite planar surface portions of the walls 46T are spaced by the same space 48, and the discs 20 are received in the same space 48. Each planar surface portion 46T is shown in FIG. 7A defined by a transducer 66 having a planar surface 66T. The transducer 66 is received in each second recess 64. Thus, the planar surface 66T defines (and is co-extensive with) the planar surface portion 46T and is effectively an extension of the wall 46 across the recess 64 in the X and Y directions. FIG. 4 shows each transducer 66 configured elongated at the angle A to the X direction, and extending from the entrance 22 to the exit 24, and further configured with a height corresponding to the diameter D of the discs.

Each transducer 66 may be configured from a suitable generator of vibrations in response to electrical input signals, and the vibrations may be in the ultrasonic or megasonic range, for example. These generators may be fabricated from piezoelectric materials, or from other suitable generator materials compatible with the cleaning solutions used for cleaning substrates.

Each transducer 66 may also be referred to as a fluid vibrator or fluid energizer or sonicator to identify the action of the transducer on the fluid 60 to provide each flow 62 as combined vibratory energy and fluid 60. The fluid may thus be referred to as energized or vibrating fluid. The opposing flows 62 of the energized fluid 60 are shown guided into the chamber 32 through fluid inlet ports 68 configured through the planar surface wall portions 46T, and extending in and through the transducer 66, and in the respective block section 34 and 36 as described below with respect to FIG. 9. Sections of each port 68 are formed in the transducers 66 and in the block sections 34 and 36 adjacent to the transducers 66. These port sections are aligned in the +Z direction. Thus, the guided fluid 60 is the energized fluid that is guided from a port 68 and through the space 48 onto the opposite sides 26 of the disc 20. The guiding by the ports 68 results in the flows 62 against the opposite sides 26, maintaining the disc in the vertical orientation and cleaning the opposite sides of the disc.

Because the transducer 66 as shown in FIGS. 4 and 5 is configured elongated and extending within the recess 64 from the entrance 22 to the exit 24, the configuration of the transducer 66 with an array of the fluid inlet ports 68 provides the array extending from the entrance 22 to the exit 24, as described below. In the context of the boundary 54 (i.e., floor 42 and end wall 50) defining the track 54T, the transducer 66 may comprise a vibration generator mounted on each of the plates (block assemblies 34 and 36) and the generator may be elongated to extend along a transport path parallel to the floor 42. Each of such generators may be configured with the series of inlet ports 68 to direct vibrating fluid against the opposite sides 26 of the discs 20 to support the discs with the opposite sides 26 spaced from the plates (i.e., spaced from the walls 46 and portions 46T) with only the edges P touching the track 54T.

Recalling that FIG. 2 shows the views for FIGS. 4 and 5 taken in opposite directions +Z and −Z respectively, the floor 42 is shown in these FIGS. 4 and 5 inclined relative to the horizontal X axis. Thus, the floor is at an angle A relative to the X axis and extends along an inclined axis AA. The floor 42 adjacent to the entrance 22 is higher than the floor 42 adjacent to the exit 24. In this manner, the chamber 32 is configured so that under the force of gravity (acting in the −Y direction) the discs 20 are caused to roll on the floor 42. The floor is thus configured to facilitate rolling of the disc from the entrance 22 to the 24, and this configuration of the floor at the incline enables the disc to roll on the floor in response to that force without structure extending into the space 48 to cause the disc to roll on the floor.

Figure 8:
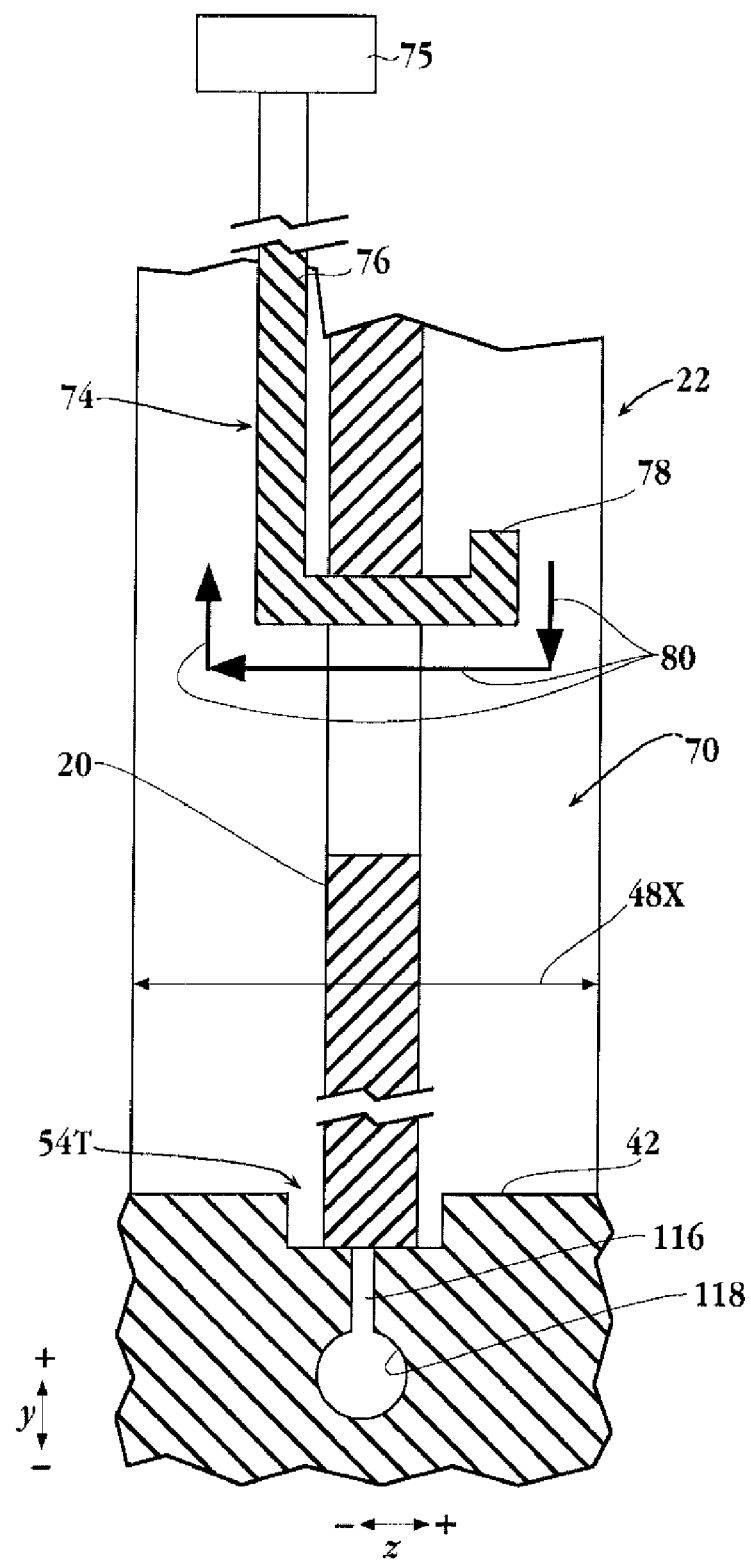
FIG. 8 is a cross sectional view taken on line 8-8 in FIG. 4 showing a disc transfer assembly in a groove for inserting a disc into the chamber for cleaning and transporting to an exit.

Referring again to FIG. 3, one disc 20 is shown by arrow IN moving into the entrance 22 of the chamber 32 and one disc 20 is shown by arrow OUT moving out of the chamber 32. To facilitate such movement, FIGS. 4, 5 and 7A show the side walls 46 (including planar surface portions 46T and 64T) of the chamber 32 further configured at the disc entrance 22 with an entrance groove 70. At the exit 24 the side walls 64 and portions 46T and 64T are formed with an exit groove 72. Representative of both grooves, FIGS. 6, 7A, and 8 show the entrance groove 70 enlarging the space 48 in the −Z and +Z directions, shown as enlarged space 48X at the entrance 22 (FIGS. 6 & 8). FIGS. 4 and 5 show both grooves 70 and 72 extending toward and to the floor (in the −Y direction). Because the grooves 70 and 72 extend into the respective block sections 34 and 36, the grooves minimize structure protruding away from the planar surfaces of the respective wall portions 46T and 64T and into the space 48. In the context of the floor 42 and ends 50 defining the track 54T, such track is further configured with the entrance 22 in the form of the groove 70 and with the exit 24 in the form of the groove 72, and the track defines the elongated transport path configured to receive a plurality of the discs at one time.

Each entrance groove 70 and exit groove 72 is configured to receive a disc transfer assembly 74 that may be configured the same for use in each groove 70 and 72. Representative of both disc transfer assemblies 74, one assembly 74 is described and is shown in FIGS. 6 and 8 in the entrance groove 70. The assembly is shown in FIG. 8 having been inserted by a drive 75 into the groove 70 while carrying the disc. FIG. 8 shows the inserted disc 20 resting on the floor 42, thus the assembly 74 is shown in position to release the disc 20. FIG. 8 shows the transfer assembly 74 configured with an arm 76. The arm 76 is configured with a hook 78 that may be inserted into the aperture of the disc 20, e.g., before insertion of the disc into the groove. The arm is configured with a length in the −Y direction enough to enable the drive 75 to extend the hook 78 into the exemplary entrance groove 70 and place the disc on the floor 42, and then to move further into the groove 70 to release to hook 78 from the disc. The arm 76 then moves in the −Z direction (left as shown in FIG. 8) to remove the hook from the disc 20. The arm 76 is then moved in the +Y direction out of the groove 70 and the disc is free to roll along the floor 42 toward the exit 24 and between the walls 46 through the opposing jets 62 for cleaning the disc. Arrows 80 indicate this release-remove-up movement, to remove the hook from the disc 20, and remove the assembly 74 from the groove 70. The assembly 74 is thus configured for travel into and out of each of the respective entrance and exit grooves 22 & 24 to respectively transfer the discs to and from the floor.

With the arm configured with the described length, to pick up a disc from the groove 70, the arm 76 with the hook 78 are lowered into the exemplary entrance groove 70 in the left position in FIG. 8, and moved in reverse of arrows 80. Thus, once the hook is aligned with the hole in the disc, the arm 76 is moved to the right to insert the hook into the hole. The arm 76 is then moved out of the groove 70 to pick up the disc from the groove 70. Also, each disc transfer assembly 74 is configured so that in a time period between disc transfers the assembly 74 is maintained out of the space 48 (i.e., out of the chamber 32). This minimizes the amount of structure in the space other than the disc 20, reducing the amount of structure in the chamber 32 that could retain particles that could deposit on the discs and interfere with the intended cleaning of the discs.

As identified above, the transducer 66 is configured with an array of the fluid inlet ports 68 extending from the entrance 22 to the exit 24. An array 82 is shown in FIGS. 4 and 7A oriented on a grid extending tipped at the angle A, and is defined by rows 84 and columns 86. One of the inlet ports 68 is provided at each intersection of the rows and columns. FIGS. 4 and 5 show the planar surfaces of the transducer 66 defining the portions 46T and thus extending the walls 46 to be elongated across the transducer 66 between the entrance 22 and the exit 24. In one embodiment in which the array 82 of the fluid inlet ports 68 extends across the transducer 66 in the rows 84 and columns 86, the energized fluid 60 may be guided into the space and uniformly onto the opposite sides of the discs. In one embodiment, the uniformity may be that each flow 60 from each of the ports 68 has the same cleaning characteristic C. In another embodiment, the flow from each port may be uniformly laminar. In another embodiment, the flow from each port may be turbulent.

FIG. 4 illustrates another embodiment in which reference lines 90 identify one cleaning section 92 of a series of cleaning sections of the array 82. Sections 92 are located between the entrance 22 and exit 24. The sections 92 follow one after another in the −X direction from entrance 22. In one embodiment, each of the sections 92 is configured so that the guided energized jets 62 (that define the combined vibratory energy and fluid) have a cleaning characteristic C that is unique to a particular one of the sections 92. For example, the generators may have different acoustic characteristics, different spacing, different flow rates, etc. As a result, as the disc 20 rolls on the floor 42 toward the exit 24 and through the different sections 92, the disc is subjected to cleaning operations having successive different cleaning characteristics (e.g., C1, C2, etc.). To suit conditions of particular discs 20 to be cleaned, those skilled in the art may, for example, arrange the ports 68 of the array 82 according to patterns other than the rows and columns. Also, as described below, the transducers 66 may be configured so that the guided energized jets 62 of each section 92 suit the conditions of particular discs 20 to be cleaned In one embodiment, a different fluid may be supplied to the different sections.

Figure 9:
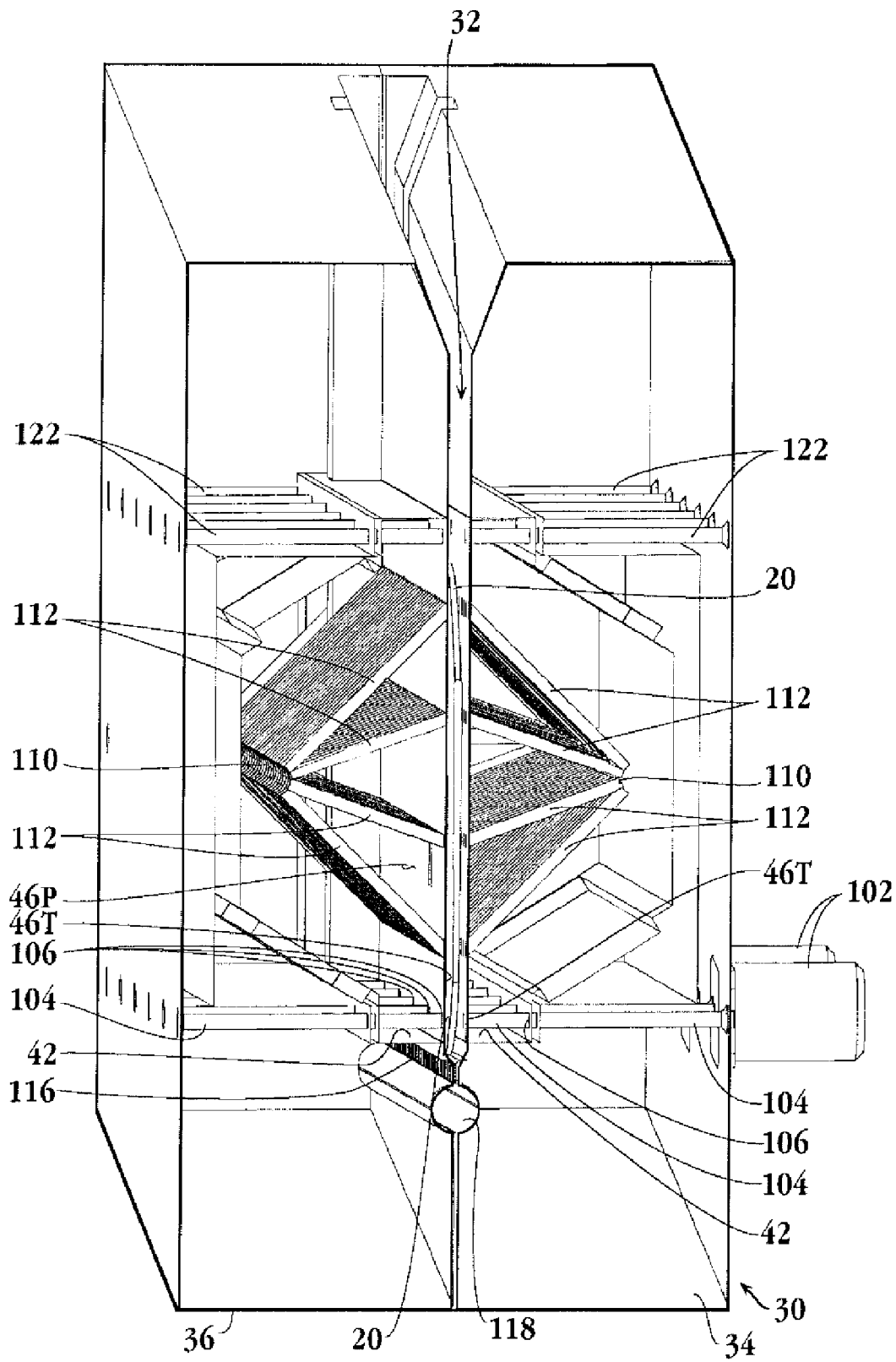
FIG. 9 is a schematic perspective view of the inside of the block assembly showing the two block sections mated, and illustrating a fluid inlet manifold in each section for supplying fluid to fluid distribution ducts connected to an array of ports extending through a transducer that energizes the fluid.

FIGS. 2, 4 and 9 show another embodiment of the present invention for configuring the cleaning operations according to the conditions of particular discs 20 to be cleaned. A controller 100 is configured to interrupt the rolling of the disc 20 at each section 92. During a selected time period, a particular disc may remain at a particular section 92 to be exposed to a different cleaning characteristic C1, C2, etc., at that section and then be released to roll to the next section 92. The controller 100 may be configured with an actuator 102 corresponding to each section 92. Exemplary ones of such actuators 102 are shown mounted in the block section 34 in a row and aligned with the incline of the floor 42. In practice, the number of actuators 102 may be equal to the number of sections 92, which may be selected according to the type of cleaning required for the particular discs 20. Each actuator 102 may, for example, be a solenoid.

FIG. 9 is a schematic view inside the block sections 34 and 36. Two of the spaced actuators 102 are shown outside the sections 34 and 36. Each actuator is configured with a disc stop pin 104 extending to the block section 34 and 36. FIGS. 4 and 9 show that in the block sections, the wall portion 46T of the chamber 32 may be configured with a hole (or stop aperture) 106 arranged to receive the stop pin 104. The stop apertures 106 are shown adjacent to the floor 42 and one corresponds to each section 92. The controller 100 controls each actuator 102, and is thus configured to move each respective pin 104 to extend from and back into the respective stop aperture 106. It may be understood that the controller 100 may be programmed so that the stop pins 104 are extended for certain periods of time so as to stop the disc from rolling past a particular section 92, providing a unique time period for the cleaning operation at each section 92. The durations of the time periods may be different at the different sections.

Embodiments of the present invention are consistent with filling the above needs by minimizing the number of particles in the cleaning chamber that originate other than by being adhered to the disc at a time when the disc is introduced into the sonication chamber. Thus, during uninterrupted disc rolling along the floor 42, the respective pin 104 is removed from the space 48 so that the pin 104 is fully surrounded by the aperture 106. The pin is thus away from particles in the chamber 32 and no particles accumulate on the pin. During interrupted disc rolling (when the pin 104 is extended into the space 48), the pin 104 is received in and cleaned by the energized fluid 60 and no particles accumulate on the pin. Also, the controller 100 is consistent with filling such needs by minimizing the retention of particles in a cleaning chamber. Thus, particles removed from one disc 20 do not linger in the chamber 32 for possible transfer to a disc that is cleaned in the same chamber at a later time. For example, the internal view of FIG. 9 and the sectional plan view of FIG. 7B, show each of the wall portions 46T configured with the planar surface to define the space 48. The retraction of the pins 104 into the apertures 106 minimizes the structure protruding into the space 48 and away from the walls 46T.

In review of the embodiments described above, the chamber 32 is configured for processing the discs 20 by cleaning and transporting the discs. The narrow thickness T is between the opposite sides 26 and the circular peripheral edge P is defined relative to the diameter D of the disc. The process chamber 32 is configured by the block 30, the block 30 being an assembly configured from the box section 34 and 36. The block 30 is thus in two parts, each part comprising a three dimensional rectangular block (e.g., a rectangular parallelepiped in the form of one box section 34 and one box section 36. The chamber 32 may also be referred to as a slot, and may comprise the opposed vertical internal walls 46 (including portions 46T) that define the slot. The walls 46 configure the slot with the narrow width of the space 48 to receive the narrow thickness T of a plurality of the discs 20. The walls 46 are also configured elongated as shown in FIG. 4 to enable the slot to receive the series of the discs. The number of discs in the series is a design choice and may be dependent on the size of the disks, the size of the cleaning unit, etc. The edge P of one disc 20 is shown adjacent to the edge P of a next disc. The walls 46 are also configured in the X direction of the elongation, with the entrance 22 and the exit 24 spaced from the entrance. The walls 46 are shown configured with an inclined depth greater than the disc diameter D, and that depth is defined by the inclined floor 42. The floor is configured to support the disc edges P with each disc of the series in the vertical orientation between the walls 46 as shown in FIG. 4. The floor 42 is tilted relative to the horizontal X axis to enable the discs to roll on the floor 42 in response to the force of gravity along the path from the entrance 22 to the exit 24.

Each wall 46 is further configured (e.g., by the transducer 66 defining wall portions, or planar surface, 46T having the ports 68) to guide the energized fluid 60 into the slot 32 against one of the opposite sides 26 of the discs. As described with respect to FIG. 7, each of the walls 46 is configured with the portion 46T by the planar surface 66T of the transducer 66 that is configured elongated (FIG. 4) to extend from the entrance 22 to the exit 24. The transducer 66 is shown in FIG. 4 configured with a height corresponding to (exceeding) the diameter D of the discs. The transducer 66 is further configured with the array 82 of the fluid inlet ports 68 extending across the X direction of elongation of the transducer and across the height to guide the energized fluid 60 into the slot 32 and uniformly onto the opposite sides 26 of the discs. The ports 68 of each box section 34 or 36 are shown in FIG. 9 supplied with the fluid 60 from a fluid inlet manifold 110. This manifold 110 is shown in FIG. 2 provided at the end of each section 34 and 36. The manifold 112 may be connected to a supply of fluid, such as deionized (DI) water, or any suitable cleaning fluid that is pressurized. Distribution ducts 112 are shown in FIG. 9. Each duct 112 directs the fluid from a respective manifold 110 to a respective one of the fluid inlet ports 68. The distribution ducts 112 thus intersect the walls 46 and define the grid pattern defined by the rows 82 and the columns 84. The ducts 112 are shown fanning out from the manifold to each of the exemplary four rows 82 and columns 84 of the array 82 (i.e., according to spacing of the ports 68 along the rows and columns). The ducts are shown fanning out from the manifold to each of the exemplary four rows 82 of ports 68 of the array 82. Forces are applied to the opposite sides 26 of the discs 20 due to the hydrostatic pressure of the fluid 60 from the manifold 110. That pressure creates the flows 62 through ports 68 of the sonic transducer 66, and these hydrostatic forces may be used to support the discs in the vertical orientation. Thus, with the combination of the track 54T and the opposing forces from the hydrostatic pressure of the jets 62, the discs will stay in an upright position and not contact the inner walls 64.

FIGS. 8 and 9 also show the chamber floor 42 configured with a series of fluid outlets 116 that are subjected to low pressure by a suction (or drain) manifold 118. The action of the drain manifold 118 on the outlets 116 is to draw the fluid and particles from the space 48 and out of the chamber 32.

The manifold 118 and outlets 116 extend under the floor 42 across the entire chamber 32. The fluid outlets 116 are perforations to allow the energized fluid 60 and particles removed from the discs 20 to flow across the opposite sides 26 and downwardly out of the block assembly 30.

It may be appreciated that by the action of the flows 162 of energized fluid 160 impacting the sides 26 of an exemplary disc 20 (at the entrance 22, for example), particles are removed from the disc 20, the disc becomes cleaner, and fewer particles may be removed as the disc rolls along the track 54T toward the exit 24, providing a cascade cleaning effect. The configuration of the manifold 110 with the series of ducts 112 in the array 82 extending between the entrance 22 and the exit 24 thus enables cleaner fluid 60 to be flowed over the ever-cleaner disc as that disc rolls down the track 54T toward the exit 24. The flow 62 of cleaner fluid 60 also drains from the sonication chamber 32 via the series of fluid outlets 116 below the disc. The series of outlets 116 extends between the entrance 22 and the exit 24, and this draining of the cleaner fluid flow 60 is immediate on flowing down past the disc 20, such that the particles removed from the disc, and the fluid 60 that collected those particles, do not remain in the sonic chamber 32. This immediate draining reduces the risk of adding more particles to the disc 20 as a result of structure that should be removing the particles from the disc 20. As described herein, the chamber 32, with the generator 66 and the manifold 110, are configured with no or minimal particle-generating structure, and with a minimum of structure inside the chamber 132 on which particles could adhere.

It may be appreciated that the configuration of the block 30 in two sections 34 and 36 facilitates ease of manufacture. For example, the mating surfaces 38 are parts of the block sections 34 and 36. The first recess 40 may easily be machined into each mating surface 38 to define the chamber 32. The second recess 64 may easily be machined into the third planar surface 46P to facilitate reception of the transducer 66 that defines the planar surface 66T for the portions 46T of the side walls 46. The planar surfaces 46P and 46T of the walls 46 are thus parallel to the X axis. The recesses for the grooves 70 and 72 may be defined in the same manner by machining into the fifth planar surface 64P of the second recess 64 to define the grooves 70 and 72. The fluid inlet manifold 110 may be configured by drilling into, or molding, for example, the end edge 51E of the block 30 so that the manifold 110 extends in the X axis direction at a slope that may match the incline angle A of the floor 42. Also, the side walls 46 and transducers 66 that face the viewer in FIGS. 4 and 5) may define the planar surfaces 46P and 46T into which the fluid ducts 112 may be drilled or molded, for example. In either case, each duct 112 may be configured (e.g., drilled) directly from the wall 46 into the section 34 or 36 and to the manifold 110. Also, the drain manifold 118 may be drilled into the In one embodiment, the drain is drilled into the mating surface 38 of blocks 34 and 36. +As well, the top 44 of the block 30 may be machined, for example, to provide a sloping surface 120 to facilitate entry of the discs into the chamber 32 when carried by the disc transfer unit 74.

In further review, the side walls 46 are configured with the sections 92. To clean one disc 20 the same on each side 26, pairs of those sections 92 are arranged oppositely, one in each block section 34 and 36, and correspond to one cleaning characteristic C. In this manner, the energized fluid 60 having the unique cleaning characteristic C may be guided into the slot 32 and uniformly onto a portion of each of the opposite sides 26 of the discs so that as a particular one of the discs rolls along the floor toward the exit 24, each side of the disc is subjected to successive different cleaning characteristics C.

The wall portions 46 are also are configured with the stop aperture 106 adjacent to the perforated floor 42 and corresponding to each section 92. The controller 100 is configured with the disc stop pin 104 received in each stop aperture 106, and the controller is further configured to move the respective pin 104 into and out of the respective stop aperture 106. During uninterrupted rolling of the discs along the floor 42 the pins 104 may be removed from the slot 32 so as to be away from the particles in the slot and so that during interrupted disc rolling the pins 104 are in the slot 32 and cleaned by the energized fluid 60 flowing downwardly directly to the perforations 110 and out of the block assembly 30.

In further review, the embodiments may provide the cleaner 30 configured with the generally U-shaped track 54T of the chamber 32, the track being configured from the pair of plates (e.g., sections 34 and 36) connected by the floor 42. With the walls 46 and planar surface portions 46 P and 46T, such plates are configured closely spaced by the space 48 and extending upwardly from the floor 42 along the opposite sides 26 of the discs supported by the floor in a vertical orientation. The track 54T is configured with the entrance 22 and the exit 24. The floor 42 is configured with the planar surface 42P extending from the entrance 22 to the exit 24 to minimize structure protruding away from the floor 42 into the track. Each of the plates is also configured with the walls 46 as planar surfaces 46P and 46T extending from adjacent to the entrance 22 and adjacent to the exit 24 to minimize structure protruding away from the plates into the track. The planar surface 42P of the floor 42 of the track MT may be inclined relative to the horizontal X axis between the entrance and exit to define the inclined transport path. The path enables a plurality of the discs 20 supported at the same time on the planar surface 42P of the floor 42 to roll on the planar surface. Each of the plates is configured with the elongated recess 64 extending parallel to the inclined transport path and floor 42, the recess 64 having a height about equal to the diameter D of the circular edge P of the disc.

The elongated transducer 66 is received in each of the elongated recesses 64 and extends along the inclined transport path. Each transducer 66 may comprise a vibration generator. Each of the transducers 66 is configured with the array 82 of ports 68 configured to supply the fluid 60 energized by the respective vibration generator against one opposite side 26 of the discs to provide sideways support for discs rolling on the planar surface 42T of the floor 42. The sideways support maintains the discs in the vertical orientation with the opposite sides 26 closely adjacent to the plates (i.e., to the side walls 46, including the portions 46T of side walls 46 of the sections 34 and 36). Only the edges P touch the planar surface 42P of the floor 42 as the discs roll along that planar surface. Each of the transducers 66 is configured with the planar surface 66T that defines the wall portion 46T that is an extension of the respective third planar surface 46P of the respective wall 46 to minimize structure protruding away from the respective third planar surface and into the track 54T. The inclined second planar surface 42P of the floor 42 is configured with the series of fluid exit outlets 116. The series extends past the disc entrance 22 to and past the disc exit 24. The exhaust manifold 118 is configured to apply low pressure to each fluid outlet 116 of the series to cause the energized fluid 60 to flow from the arrays 82 of fluid supply ports 68 along the opposite sides 26 to and through the fluid exit outlets 116 to remove from the track energized fluid 60 and particles removed from the discs 20.

In further review, the array of ports 68 extends parallel to the incline of the transport path and extends from the disc entrance 22 to the disc exit 24. The array 82 is configured with separate groups, or sections, 92 of the ports 68 at locations identified by the lines 90 along the inclined path. Each of the ports 68 of a first exemplary group, or section, 92 is configured to supply the energized fluid 60 having a different cleaning characteristic C than a cleaning characteristic C of the ports 68 of a second section 92.

In further review, one embodiment of the present invention may include a cleaning chamber 32 in the following configuration. The chamber 32 may comprise a box 30 in a rectangular or parallelogram configuration. The box 30 may be configured from a plurality of separate box sections 34 and 36 to receive, and via sonically energized fluid, to clean the thin discs 20, and to transport the discs in the box. Each of the separate sections 92 may be configured with the continuous perimeter 52 defined by the first planar mating surface 38 extending on the respective box section 34 or 36 in the longitudinal X direction from the disc entrance 22 to the disc exit 24. The sections 34 and 36 may also extend in the vertical Y direction perpendicular to the longitudinal X direction to define four sides (two outer edges 51E, an outer side 51S, and mating surface 38) of each of the box sections 34 and 36. Each of the sections 34 and 36 is further configured with the first recess 40 extending through the first planar mating surface 38 in the thickness direction Z (transverse to the longitudinal X direction). The first recess 40 extends in the longitudinal X direction from the disc entrance 22 to the disc exit 24 and extends in the vertical Y direction transverse to the longitudinal X and transverse Z directions to the planar terminus (or surface) 42P that defines the floor 42. Each first recess 40 defines the side wall 46 as the third planar surface 46P parallel to the first parallel mating surface 38. The floor 42 is inclined relative to the longitudinal X direction along the inclined axis AA (FIG. 4, i.e., at the angle A) so that the entrance 22 of the floor 42 adjacent to the disc entrance 22 has a vertical dimension (Y direction) less than a vertical dimension of the floor 42 adjacent to the disc exit 24. The fluid inlet manifold 110 in each section 34 and 36 is parallel to the inclined axis AA. Each of the first recesses 40 is further configured with the second recess 64 extending through the first planar (or mating) surface 38 in the thickness Z direction. The recess 64 extends in the direction of the inclined axis AA from the disc entrance 22 to the disc exit 24 and extends in the vertical Y direction transverse to the inclined axis AA and transverse to the transverse directions X and Z to a second terminus adjacent to the floor. The recess 64 defines the fifth planar surface 64P that is parallel to the first planar surface 38 and parallel to the side walls 46. Each box section 34 and 36 is further configured with the array 82 of fluid entrance ports 68 extending through the third planar surface 66P in the thickness Z direction. Relative to the array 82 of the ports 68 in the transducer plate 66, the array in the sections 34 and 36 is a first array. The ports 68 are spaced along the inclined axis AA and intersected by the fluid inlet manifold 110. One of the elongated transducer plates 66 is received in each of the second recesses 64 and extends in the direction of the inclined axis AA. Each transducer plate 66 is configured with a second array 82 of fluid ports 68. Each port 68 in one transducer plate 66 is configured aligned with one of the fluid entrance ports 68 in the corresponding box section. Such one port 68 is opposed to and aligned with a fluid outlet port 68 in the other box section. The ports 68 in the transducer 66 receive the energized fluid 60 from the aligned port 68 in the sections 34 and 36 and supply the energized fluid 60 against the side 26 of one of the discs 20. Opposite sides 26 of the disc 20 are impacted by the supplied energized fluid 60 to provide support in the transverse Z direction for discs rolling on the floor 42. The support in the Z direction maintains the discs in the vertical orientation with the opposite sides 26 closely adjacent to the transducer plates 66 and only circular edges P of the discs touching the floor 42 (i.e., the second planar surface 42P) as the discs roll along the floor. Each of the transducer plates 66 with the respective array of ports 68 is configured with a planar surface 66T that is an extension of the respective third planar surface 46P of the respective box section to minimize structure protruding away from the respective third planar surface. Each box section 34 and 36 is further configured with the drain outlets 116 providing openings through the floor 42 through which to drain the energized fluid 60 and particles from the chamber 32. The box sections 34 and 36 are further configured to receive a series of connectors (i.e., fasteners) to join the box sections along the first planar mating surface 38 (along the continuous perimeter 52) so that the third planar surfaces 46P and the fourth planar surfaces 50P recesses define opposite sides of the cleaning and transport chamber 32.

Another embodiment of the present invention may include the cleaning chamber 32 in the following configuration for cleaning and transporting a disc 20. The disc may have opposite sides 26, the circular edge P between the sides 26, and a hole in the center spaced from the edge P. The cleaning and transporting chamber may be configured to minimize retention of particles removed from the disc. The chamber 32 is configured from the elongated rectangular block 30 having the opposite planar sides: the top 44, the bottom 51B and opposite edges 51E. The block 30 may be configured with the spaced fluid supply manifolds 110 and the fluid exit manifold 118. The block 30 may be configured with the chamber 32 as a sonication cavity in which cleaning in response to the sonically energized fluid occurs. The cavity extends through the top 44 and toward the bottom 51B to define the opposite cavity ends 50 and the opposite cavity walls 46 extending to the floor 42 of the disc track 54T inclined with respect to the bottom 51B. The opposite cavity ends 50 and opposite cavity walls 46 define the chamber 32 as being closed with the top 44 having the opening 58. One cavity end 50 is defined as the disc entrance 22 and the other end as the disc exit 24. Each opposite cavity wall 46 is configured intersected by the first array 82 of fluid supply ports 68, the first array extending between the cavity ends 50 and extending to one of the fluid supply manifolds 110. The disc track 54T is configured intersected by a second array of fluid exit ports 116, the second array being configured to extend between the cavity ends 50 with each fluid exit port 116 connected to the fluid exit manifold 118. The block is configured with each of the opposite cavity walls 46 spaced by a first distance 48 to receive the disc 20 in the vertical orientation extending to the disc track 54T. The block 30 is configured with each of the opposite cavity walls 46 being planar except for the elongated recess 64 extending between the ends 50 and into each cavity wall 46 and except for the disc transfer groove 70 and 72 at each of the disc entrance 22 and disc exit 24. The disc transfer grooves are wider (at 48X) than the first distance 48.

A vibration generator comprising the transducer 66 is configured for reception in each of the elongated recesses 64 in each of the cavity walls 46 so as to configure each opposite cavity wall 46 as a planar surface 46P and 46T. Each transducer 66 is configured with the array 82 of the fluid supply ports 68. Each port of the array 82 of one transducer 66 is aligned with one of the ports 68 of the array 82 of the other transducer. Each transducer 66 is configured to sonically energize the fluid in the ports 68 of the arrays 82, so the energized fluid 60 enter the cavity 32 to impinge on the opposite sides 26 of the disc.

Figure 10:
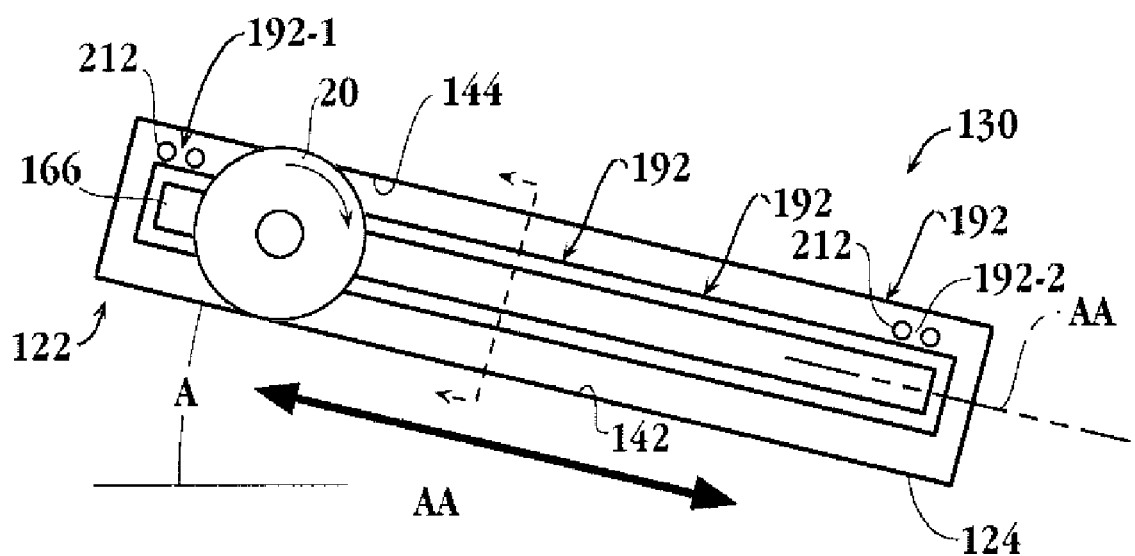
FIGS. 10 and 11 are views of one embodiment of the invention, illustrating fluid flowing through a neck in which the fluid is energized as the fluid impacts against opposite sides of a disc.
Figure 11:
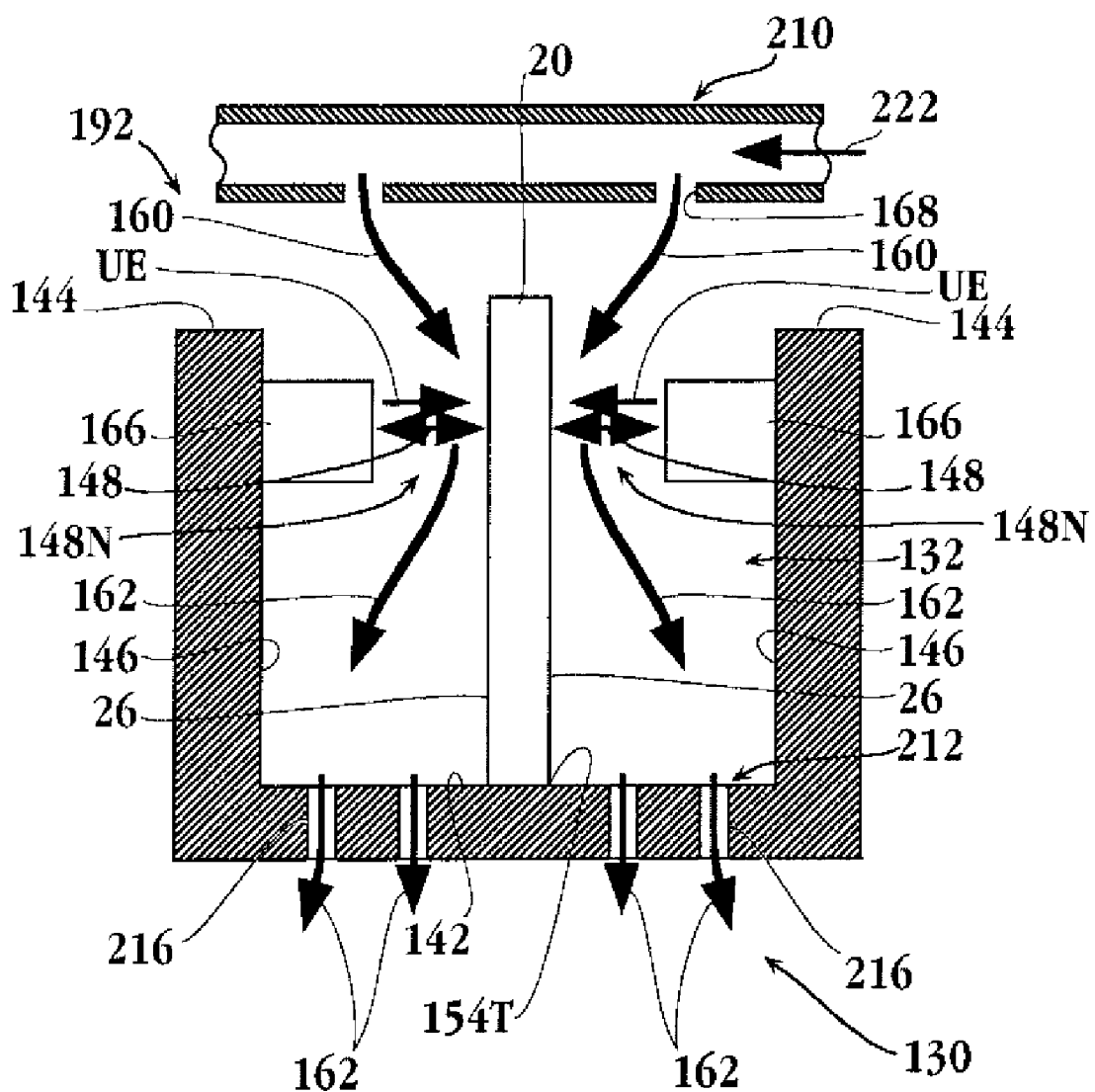

Another embodiment of the sonication cleaner 30 of the present invention is shown in FIG. 10 as the sonication cleaner 130. The same disc 20 is referred to in describing an example of the cleaner 130, and similar elements of the structure are identified by adding 100 to the reference number used above. At the disc entrance 122 the disc 20 is inserted into a sonication chamber (or guideway or tunnel or open top tunnel) 132 that extends along the inclined axis AA in a disc transport direction. The tunnel 132 is configured elongated and extends from the entrance 122 to the exit 124. The insertion of the discs 20 is one after another to cascade the operations. The tunnel 132 is skewed relative to horizontal, i.e., tipped at the angle A relative to horizontal. FIGS. 10 & 11 show that the tunnel 132 may be configured with side walls 146 that define the narrow space 148 in the horizontal Z direction that is transverse to the axis AA. The side walls 146 may be joined by a bottom, or floor, 142 of the chamber 132. The floor 142 is configured with a central roll track 154T centered between the side walls 146. The floor 142 is perforated on each opposite side of the track 154T by fluid outlets 216. The side walls 146 are upstanding and extend above the bottom to a top 144 of the walls 146. The top 144 is about the height above the floor 142 as a top of a disc 20 that is received in the chamber 132 between the walls 146.

Cleaning of the disc 20 in the chamber 132 is by two facilities, the transducer (or ultrasonic generator) 166, and fluid (see arrow 160, FIG. 11) through which ultrasonic energy UE is directed as the energy is transmitted perpendicular to the sides 26 of the disc 20. The ultrasonic generator 166 is configured elongated to extend from the entrance 122 to the exit 124. The generator 166 also may have a height and thickness perpendicular to the walls 206 so that the sonication portion of the chamber 132 (including the space 148) is configured as a narrow passage, or dual cleaning zone, 148N extending along the entire length of the generator 166 in the direction of the axis AA. The generator 166 may be any suitable acoustic energy generator (megasonic or ultrasonic) described above with respect to the transducer 66. The narrow passage 148N is thus an elongated neck into which the energy UE is transmitted and through which the fluid 166 is downwardly directed from ports 168 of the elongated fluid fountain (or manifold) 168. The ports 168 extend in the array 182 from the entrance 122 to the exit 124, i.e., at closely spaced locations in the direction of the axis AA. FIG. 11 shows that the inserted disc 20 is received in this narrow passage 148N. The insertion of the discs 20 into the chamber 132 at the entrance 122, and the removal of the clean disc from the top of the exit 124, may each be by the disc transfer assembly 174 similar to the assembly 74.

Considering one section 192 of the neck 148N near the entrance 122, it may be understood that the fluid 160 and the energy UE combine in the section 192 to start a process of cleaning the opposite sides 26 of the disc 20 that has been inserted into the chamber 132. The neck 148N focuses the fluid 160 from the ports 168 so that there is the flow (see arrows 162) of fluid 160 toward and along each side 26 of the disc and across the generator 166 adjacent to that side 26. The energy UE transmitted through the fluid 160 and perpendicular to the side 26 fosters releasing particles from the side 26. The energy UE also energizes (or sonicates) the fluid 160, which fosters releasing particles from the side 26 and the flow 162 carries the released particles across the side 26, downwardly away from the disc 20, and directly from the disc and from the chamber 132 through the fluid outlets 216 to a fluid collector (or suction drain manifold, 218) below the chamber 132. Because the disc 20 near the entrance 122 is likely to be "dirtier" than discs in the chamber 132 nearer the exit 124, the generator 166 may be configured with different axially-spaced sections 192. Exemplary sections 192 are shown as sections 192-1 & 192-2. The exemplary section 192-1 may transmit a higher amount of energy into the chamber 132 near the entrance 122 than is transmitted by the section 192-2 or 192-3 into the chamber 132 downstream of the entrance 122. The section 192 may otherwise tailor the energy UE to suit the conditions along the track 154T or the conditions of the discs 20. In one embodiment, the sections 192 may be configured with a length in the direction of the axis AA of about Π times the diameter of the disc 20, for example, which represents a value of the perimeter P of the disc 20. In other embodiments, the sections 192 may be configured with a different length in the direction AA to suit other conditions, e.g., a desired time period of sonic cleaning exposed to the energy UE in a section 192.

FIG. 10 also shows that the fluid manifold 210 may be configured with a series of the distribution ducts 212, each duct being configured to extend to one port 168 (FIG. 11). The manifold 210 may be connected to a supply of fluid, such as deionized (DI) water, or any suitable cleaning fluid that is pressurized. The ducts 212 with the outlet ports 168 may be spaced along the axis AA (e.g., as part of the section 192) to direct the fluid 160 toward and along the disc sides 36 and into the neck 148N to establish the flows 162 of energized fluid 160. By the action of the flows 162 of energized fluid 160 impacting the sides 26 of an exemplary disc 20 (at the entrance 122, for example), particles are removed from the disc 20, the disc becomes cleaner, and fewer particles may be removed as the disc rolls along the track 154T toward the exit 124, again providing a cascade cleaning effect. The configuration of the manifold 210 with the series of ducts 212 in the array 182 extending between the entrance 122 and the exit 124 thus enables cleaner fluid 160 to be flowed over the ever-cleaner disc as that disc rolls down the track 154T toward the exit 124. The flow 162 of cleaner fluid 160 also drains from the tunnel 132 via the series of fluid outlets 216 below the disc. The series of outlets 216 extends between the entrance 122 and the exit 124. This draining of the cleaner fluid flow 162 is immediately on flowing down past the disc 20, such that the particles removed from the disc, and the fluid 160 that collected those particles, do not remain in the tunnel 132. This immediate draining reduces the risk of adding more particles to the disc 20 as a result of structure that should be removing the particles from the disc 20. In this regard, the tunnel 132, with the generator 166 and the manifold 210, are configured with no or minimal particle-generating structure, and with a minimum of structure inside the chamber 132 on which particles could adhere.

Embodiments of the present invention include a method of cleaning and transporting a disc 20 shown in flow chart 630 in FIG. 12. The method may move to an operation 632 of enclosing the disc in a narrow elongated space extending from a disc entrance to a disc exit, the space being defined by opposed surfaces and the enclosed disc being supported on an inclined floor. The enclosing operation 632 may be performed by inserting the disc 20 into the chamber 32 at the groove 70 using the disc transfer assembly 74. The inserted disc 20 is thus received in and enclosed by the narrow elongated space 48 extending from the disc entrance 22 to the disc exit 24. The space 48 is defined by the opposed planar surfaces 46P and 46T. The enclosed disc is supported on the inclined floor 42. Also, a vertical position with opposite sides of the disc exposed. In operation 632 the vertical position of the disc 20 may be in the tunnel 32 with opposite sides 26 of the disc exposed for cleaning.

The method may move to an operation 634 of directing energized fluid through each opposed surface onto the enclosed supported disc to position the disc in a vertical orientation between the opposed surfaces. The directing operation 634 may be performed by supplying the fluid 60 from the manifold 110 to the ports 68 and into the space 48. The fluid 60 is energized by the transducer 66. The ports direct the energized fluid 60 onto the sides 26 of the enclosed supported disc 20 to position the disc in the vertical orientation shown in FIG. 4 between the opposed planar surfaces 46P and 46T. Also, referring to FIG. 11, the directing may direct spaced flows 162 of the fluid 160 toward and along each of the sides 26 of the disc 20 while the generator 166 contemporaneously transmits the ultrasonic energy UE perpendicularly toward each of the sides 26 of the disc 20. The directing and transmitting may each be along the elongated inclined pathway of the track 154T. Referring to FIGS. 10 and 11, operation 134 may also provide clean fluid 160 flowing continuously from above the disc 20 (from the ports 168) as the disc rolls from the entrance 122 to the exit 124, and renders the transmitting effective along the entire length of elongated inclined track 54T to energize the fluid 160 and impact the opposite sides 26 of the disc. Embodiments of the method may, for example, provide the directing operation to organize individual jets 62 of energized fluid 60 into separate groups spaced along the opposed surfaces 46P and 46T. Each of the jets 62 of one group may have a disc-cleaning characteristic C different from a disc characteristic C of the jets 62 of another group.

The method may move to an operation 636 of allowing the enclosed supported disc 20 to roll on the floor 42 through the energized fluid, and the method is done. The allowing operation 636 may be performed by the solenoid 102 at the entrance 22 withdrawing the pin 104 from the track 54T and thus releasing the disc from being blocked, and allowing the force of gravity to cause the enclosed supported disc 20 to roll on the floor 42 through the energized fluid 60. In one embodiment, FIGS. 10 & 11 indicate that operation 636 allows the disc 20 to roll under the force of gravity along the elongated inclined pathway of the track 154T so that the spaced flows 162 of fluid 160 flow toward and along each of the sides 26 of the disc. The ultrasonic or megasonic energy UE is simultaneously transmitted from the transducers 166 through the fluid 160 perpendicularly toward each of the sides 26 of the disc. The spaced flows 162 of fluid 160 flow toward and along each of the sides 26 of the disc to keep the disc in the vertical position shown in FIG. 11.

Another embodiment of the present invention may include a method of cleaning and transporting a disc 20 shown in flow chart 640 in FIG. 13. The method may move to an operation 642 of performing the method of flow chart 630. The method may move to an operation 644 performed at the exit of removing a disc from between the opposed surfaces to make room along the floor for another disc on the floor at the entrance, and the method is done. Operation 644 may be performed at the exit 24 by the disc transfer assembly 74 to remove the disc 20 that is at the exit 24. The disc is removed from between the opposed surfaces 64P and 64T. The removal of the disc leaves a space along the track 54T, making room along the floor 42 for another disc on the floor at the entrance 22.

Another embodiment of the present invention may include a method of cleaning and transporting a disc 20 shown in flow chart 650 in FIG. 14. The method may move to an operation 652 of performing the method of flow chart 630, and then moving to an operation 654 of interrupting the rolling of the disc at a predetermined location between the entrance and the end, and the method is done. Operation 654 may be performed at any location along the track 54T at which a stop pin 104 is located. Under the control of the controller 100, the solenoid 102 may insert the pin 104 into (across) the track 54T to block the track 54T, thus interrupting the rolling of the disc 20 that is uphill of the pin 104. Embodiments of the methods of the invention may further remove the energized fluid 160 from the space 48 or 148 to carry particles from the disc 20 out of the space.

In review, embodiments of the present invention fill the above needs by providing methods of and apparatus configured to clean the discs quickly by way of the combined fluid and sonic energization of the fluid 60 or 160. For example, the disc 20 may roll on the floor 42 toward the exit 24 through the different sections 92, at which the disc is subjected to cleaning operations having successive different cleaning characteristics (e.g., C1, C2, etc.). To suit conditions of particular discs 20 to be cleaned, one section 92 may, for example, have the ports 68 of the array 82 arranged according to patterns other than the rows and columns. Also, the transducers 66 may be configured so that the guided energized jets 62 of each section 92 suit the conditions of particular discs 20 to be cleaned. In each case, a section 82 may be configured to reduce the time required to perform a particular cleaning operation on a disc, thus making it possible to reduce the overall time required to clean a particular disc.

In turn, during the cleaning operation of one disc (as the disc rolls down the floor 42 from the entrance 22 to the exit 24), more time may be spent cleaning a particular disc. Thus, by the operation of the controller 100, the stop pins 104 may increase contact time at the fluid-disc interface in a specific section 92 only as required for the condition of the specific disc as presented at the section 92.

Embodiments of the present invention are consistent with filling the above needs by minimizing the number of particles in a cleaning chamber that originate other than by being adhered to the workpiece at a time when the workpiece is introduced into the chamber, and by minimizing the retention of particles in a cleaning chamber so that particles removed from one workpiece do not linger in the chamber for possible transfer to a workpiece that is cleaned in the same chamber at a later time. For example, during uninterrupted disc rolling along the floor 62, the respective pin 104 is removed from the space 48 so that the pin 104 is fully surrounded by the aperture 106. The pin is thus away from particles in the chamber 32 and no particles accumulate on the pin. During interrupted disc rolling when the pin 104 is extended into the space 48, the pin 104 is received in and cleaned by the energized fluid 60 and no particles accumulate on the pin.

Also, the controller 100 is consistent with filling such needs by minimizing the retention of particles in a cleaning chamber. Thus, by the pin movement, particles removed from one disc 20 do not linger in the chamber 32 for possible transfer to a disc that is cleaned in the same chamber at a later time. For example, the internal view of FIG. 9 and the sectional plan view of FIG. 7B, show each of the walls 46 configured with the planar surfaces 46P and 46T to define the space 48. The retraction of the pins 104 into the apertures 106 minimizes the structure protruding into the space 48 and away from the walls 46T. Also, each disc transfer assembly 74 is configured so that in a time period between disc transfers the assembly 74 is maintained out of the space 48 (i.e., out of the chamber 32). This minimizes the amount of structure in the space other than the disc 20, reducing the amount of structure in the chamber 32 that could retain particles that could deposit on the discs and interfere with the intended cleaning of the discs. Further, the action of the drain manifold 118 on the outlets 116 (immediately drawing the fluid and particles from the space 48 and draining them out of the chamber 32) minimizes the possibility that particles could be retained in the chamber 32 and deposit on the discs and interfere with the intended cleaning of the discs. This immediate draining reduces the risk of adding more particles to the disc 20 as a result of structure that should be removing the particles from the disc 20.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. For example, other embodiments may be provided to meet the above-described needs of minimizing particles in a cleaning chamber that originate other than by being adhered to the disc at a time when the disc is introduced into the chamber, and of minimizing the retention of particles in a cleaning chamber so that particles removed from one disc do not linger in the chamber for possible transfer to a disc that is cleaned in the same chamber at a later time. Such other embodiments may configure the track 54T of the chamber 32 in a horizontal orientation rather than inclined. The discs may be conveyed along the floor 42 of the track 54T by a rod-like pusher, that, for example, rests on the floor 42 and advances in the +X direction along the floor 42 to move the disc 20 along the track 54T from the entrance 22 to the exit 24 while allowing the disc to rotate. The pusher may be configured so that the fluid 60 and particles will flow around the pusher and into the outlets 116. In this manner, the outlet manifold 118 will cause the fluid to carry the undesired particles past the pusher and out of the chamber, minimizing the retention of particles in the chamber so that particles removed from one disc do not linger in the chamber for possible transfer to a disc that is cleaned in the same chamber at a later time. Accordingly, the present embodiments are to be considered as illustrative and not restrictive, and the invention is not to be limited to the details given herein, but may be modified within the scope and equivalents of the appended claims. In the claims, elements and/or operation do not imply any particular order of operation, unless explicitly stated in the claims.

What is claimed is:

1. Apparatus for cleaning and transporting a circular disc having opposite sides, the apparatus comprising:
    a floor configured to support the disc in a vertical orientation;
    walls extending from the floor, the walls including end walls and side walls configured to define a space enclosing the disc supported on the floor, each side wall being further configured to guide fluid through the space onto the opposite sides of the disc to maintain the disc in the vertical orientation and clean the opposite sides of the disc, the floor is configured at an angle relative to horizontal to facilitate rolling and translation of the disc, the fluid impacting surfaces of the opposite sides of the disc perpendicularly and
    an opening defined along a top surface of the walls enabling entrance and exit of the disc into the space.

2. Apparatus as recited in claim 1, wherein each of the side walls includes a transducer configured with an array of fluid outlet ports.

3. Apparatus as recited in claim 1, wherein the side walls are further configured elongated between an entrance end and an exit end and with a series of sections between the entrance end and exit end, each of the sections being configured to guide combined vibratory energy and fluid having a cleaning characteristic that is unique to a particular one of the sections so that as the disc rolls on the floor toward the exit end the disc is subjected to successive different cleaning characteristics.

4. Apparatus as recited in claim 3, further comprising:
    a controller configured with a disc stop pin corresponding to each section, the disc stop pin being arranged to interrupt the rolling of the disc at each of the sections for cleaning in response to the different cleaning characteristics.

5. Apparatus as recited in claim 4, wherein:
    the side walls are further configured with a stop aperture adjacent to the floor and corresponding to each section; and
    the controller is configured with the disc stop pin received in each stop aperture, the controller being further configured to move each respective pin into and out of the respective stop aperture so that during uninterrupted disc rolling along the floor the respective pin is removed from the space away from particles in the slot and so that during interrupted disc rolling the pins are cleaned by the combined vibratory energy and fluid.

6. Apparatus as recited in claim 3, wherein the side walls are further configured adjacent to the entrance end with an entrance grove and adjacent to the exit end with an exit groove, one of the grooves extending toward the floor and into a respective one of the side walls to minimize structure protruding away from the planar surface of the respective side wall.

7. Apparatus as recited in claim 6, the apparatus further comprising a disc transfer assembly configured for travel into and out of each of the entrance and exit grooves to respectively transfer the discs to and from the floor, each disc transfer assembly being configured to be maintained out of the space between disc transfers to minimize structure in the space other than the disc.

8. Apparatus as recited in claim 1, wherein:
    each of the side walls and floor is configured with a planar configuration that is devoid of structure extending into the space; and
    the side walls configured with the planar configuration comprise a transducer configured with an array of fluid inlet ports extending across the transducer to guide the combined vibratory energy and fluid into the space and uniformly onto the opposite sides of the discs.

9. Apparatus as recited in claim 1, wherein the floor is configured with a series of outlets subjected to low pressure to draw the fluid and particles from the space and out of the apparatus.

10. Apparatus as recited in claim 1, wherein the floor is configured to extend at an incline relative to horizontal to enable the disc to roll on the floor in response to the force of gravity without structure extending into the space for causing the disc to roll on the floor.

11. A process chamber for cleaning and transporting discs, the discs being configured with a narrow thickness between opposite sides and with a circular peripheral edge defined relative to a diameter, the process chamber comprising:
    a block assembly configured with opposed vertical internal walls that define a slot along a top surface of the walls, the walls configuring the slot with a narrow width to receive the narrow thickness of a plurality of the discs, the walls being configured elongated to enable the slot to receive a series of the discs with an edge of one disc being adjacent to an edge of a next disc, the walls being configured in a direction of the elongation with an entrance end and an exit end spaced from the entrance end, the entrance end and the exit end defined through the top surface, the walls being configured with a depth greater than the disc diameter, the depth being defined by a floor configured to support the disc edges with each disc of the series in a vertical orientation between the walls, the floor being tilted relative to horizontal to enable the discs to roll on the floor in response to the force of gravity along a path from the entrance end to the exit end, each wall being further configured to guide energized fluid into the slot against one of the opposite sides of the discs and to maintain the discs in the vertical orientation between the walls and to remove particles from the discs while the discs roll on the floor, the floor being configured with perforations to allow the energized fluid and particles to flow across the opposite sides and downwardly out of the block assembly the fluid impacting surfaces of the opposite sides of the discs perpendicularly.

12. A process chamber as recited in claim 11, wherein:
the opposed walls are further configured adjacent to the entrance end with an entrance groove extending toward the floor; and
the opposed walls are further configured adjacent to the exit end with an exit groove extending toward the floor.

13. A process chamber as recited in claim 11, wherein each of the walls comprises a transducer configured elongated to extend from the entrance end to the exit end, the transducer being further configured with a height corresponding to the diameter of the discs, the transducer being further configured with an array of fluid inlet ports extending across the elongation of the transducer and across the height to guide the energized fluid into the slot and uniformly onto the opposite sides of the discs.

14. A process chamber as recited in claim 11, the chamber further comprising a controller configured to interrupt rolling of the discs.

15. A process chamber as recited in claim 11, the process chamber further comprising a disc transfer unit configured for travel into and out of each of an entrance and exit grooves to respectively transfer the discs to and from the floor, each disc transfer unit being configured to be maintained out of the slot in a time period between disc transfers to minimize the duration of structure protruding into the slot away from the planar surface of the respective wall.

16. A process chamber as recited in claim 11, wherein the floor configured with perforations is further configured with a suction duct connected to each of the perforations to draw the energized fluid and particles from the slot and out of the block assembly.

17. Apparatus as recited in claim 1 wherein the entrance and the exit include opposing grooves defined in each of the side walls and extending from the top surface to the floor thereby enabling a disk transfer assembly access to and from the entrance and exit.

18. Apparatus as recited in claim 17 wherein the disk transfer assembly is an arm having a hook at one end of the arm.

19. A process chamber as recited in claim 11 wherein the entrance end and the exit end include opposing grooves defined in each of the sidewalls and extending from the top surface to the floor thereby enabling a disk transfer assembly access to and from the entrance end and the exit end.

20. A process chamber as recited in claim 19 wherein the disk transfer assembly is an arm having a hook at one end of the arm.

* * * * *